(12) United States Patent
Kwak et al.

(10) Patent No.: US 12,361,989 B2
(45) Date of Patent: Jul. 15, 2025

(54) SEMICONDUCTOR SYSTEM

(71) Applicant: SK hynix Inc., Icheon-si Gyeonggi-do (KR)

(72) Inventors: Kang Sub Kwak, Icheon-si Gyeonggi-do (KR); Sang Sic Yoon, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 136 days.

(21) Appl. No.: 18/301,441

(22) Filed: Apr. 17, 2023

(65) Prior Publication Data

US 2024/0185902 A1 Jun. 6, 2024

(30) Foreign Application Priority Data

Dec. 2, 2022 (KR) .................. 10-2022-0167132

(51) Int. Cl.
*G11C 8/00* (2006.01)
*G11C 7/10* (2006.01)
*G11C 7/22* (2006.01)

(52) U.S. Cl.
CPC ............ *G11C 7/222* (2013.01); *G11C 7/1087* (2013.01); *G11C 7/109* (2013.01)

(58) Field of Classification Search
CPC .................................................... G11C 7/222
See application file for complete search history.

(56) References Cited

U.S. PATENT DOCUMENTS

| 11,227,643 B1* | 1/2022 | Kim | ..................... G11C 7/1066 |
| 2022/0013156 A1 | 1/2022 | Penney et al. | |
| 2023/0154508 A1* | 5/2023 | Kim | ..................... G11C 7/225 365/189.05 |

FOREIGN PATENT DOCUMENTS

| KR | 1020070036635 A | 4/2007 |
| KR | 100929828 B1 | 12/2009 |

* cited by examiner

*Primary Examiner* — Hoai V Ho
(74) *Attorney, Agent, or Firm* — WILLIAM PARK & ASSOCIATES LTD.

(57) ABSTRACT

A semiconductor device includes a driving signal generation circuit configured to generate a pull-up driving signal that is enabled when a data clock input control signal is input during a normal operation, configured to generate a pull-down driving signal that is enabled when any one of a write signal and a read signal is input, and configured to generate the pull-down driving signal that is enabled after a set interval when a synchronization signal is input, and a sync enable signal generation circuit configured to generate a sync enable signal for receiving a data clock from a time at which the pull-up driving signal is enabled to a time at which the pull-down driving signal is enabled.

14 Claims, 21 Drawing Sheets

SEMICONDUCTOR SYSTEM

CROSS-REFERENCE TO RELATED APPLICATION

The present application claims priority under 35 U.S.C. § 119(a) to Korean application number 10-2022-0167132, filed in the Korean Intellectual Property Office on Dec. 2, 2022, the entire disclosure of which is incorporated herein by reference.

BACKGROUND

1. Technical Field

Various embodiments of the present disclosure generally relate to a semiconductor system, and more particularly, to a semiconductor system capable of extending a clock synchronization operation during a read operation and a write operation.

2. Related Art

Recently, as the operating speed of a semiconductor system is increased, a high-speed data transfer rate tends to be required between semiconductor devices that are included in the semiconductor system. In order to satisfy a high-speed data transfer rate or data high bandwidth of data that are input and output in series between the semiconductor devices, new technologies are applied.

For example, in order to input and output data at a high speed, a clock dividing scheme is used. When a clock is divided, a multi-phase clock having different phases is generated. Data are input and output at a high speed by parallelizing or serializing the data by using the multi-phase clock.

SUMMARY

In an embodiment, a semiconductor device may include a driving signal generation circuit configured to generate a pull-up driving signal that is enabled when a data clock input control signal is input during a normal operation, configured to generate a pull-down driving signal that is enabled when any one of a write signal and a read signal is input, and configured to generate the pull-down driving signal that is enabled after a set interval when a synchronization signal is input, and a sync enable signal generation circuit configured to generate a sync enable signal for receiving a data clock from a time at which the pull-up driving signal is enabled to a time at which the pull-down driving signal is enabled.

Furthermore, in an embodiment, a semiconductor device may include a driving signal generation circuit configured to generate a pull-up driving signal that is enabled when a data clock input control signal is input during a normal operation, configured to generate a pull-down driving signal that is enabled when any one of a write signal and a read signal is input, and configured to block the input of the write signal and the read signal when a synchronization signal is input, and a sync enable signal generation circuit configured to generate a sync enable signal for receiving a data clock from a time at which the pull-up driving signal is enabled to a time at which the pull-down driving signal is enabled.

Furthermore, in an embodiment, a semiconductor device may include a driving signal generation circuit configured to generate a pull-up driving signal that is enabled when a data clock input control signal is input during a normal operation and configured to generate a pull-down driving signal that is enabled when any one of a write signal, a read signal, and a synchronization signal is input, and a sync enable signal generation circuit configured to generate a sync enable signal for receiving a data clock from a time at which the pull-up driving signal is enabled to a time at which the pull-down driving signal is enabled.

Furthermore, in an embodiment, a semiconductor device may include a driving signal generation circuit configured to generate a pull-up driving signal that is enabled when a data clock input control signal is input during a normal operation, configured to generate a pull-down driving signal that is enabled based on a write signal, a read signal, and a flag signal, and configured to delay timing at which the pull-down driving signal is enabled when the flag signal is enabled, and a sync enable signal generation circuit configured to generate a sync enable signal for receiving a data clock from a time at which the pull-up driving signal is enabled to a time at which the pull-down driving signal is enabled.

Furthermore, in an embodiment, a semiconductor device may include a control circuit configured to generate a sync enable signal that is enabled during the interval of a write operation and a read operation during a normal operation and configured to extend an interval in which the sync enable signal is enabled when a synchronization signal is input before the write operation and the read operation are completed, and a data clock input circuit configured to receive a data clock during the interval in which the sync enable signal is enabled and configured to generate first to fourth internal clocks by dividing a frequency of the data clock that has been received.

Furthermore, in an embodiment, a semiconductor system may include a controller configured to output a command address and a data clock and configured to input and output data, a first memory device configured to input and output the data in synchronization with the data clock when performing a normal operation based on the command address, and a second memory device configured to perform a data clock extension operation of extending an interval in which the data clock is received based on the command address when the first memory device performs the normal operation.

DETAILED DESCRIPTION

Figure 1:
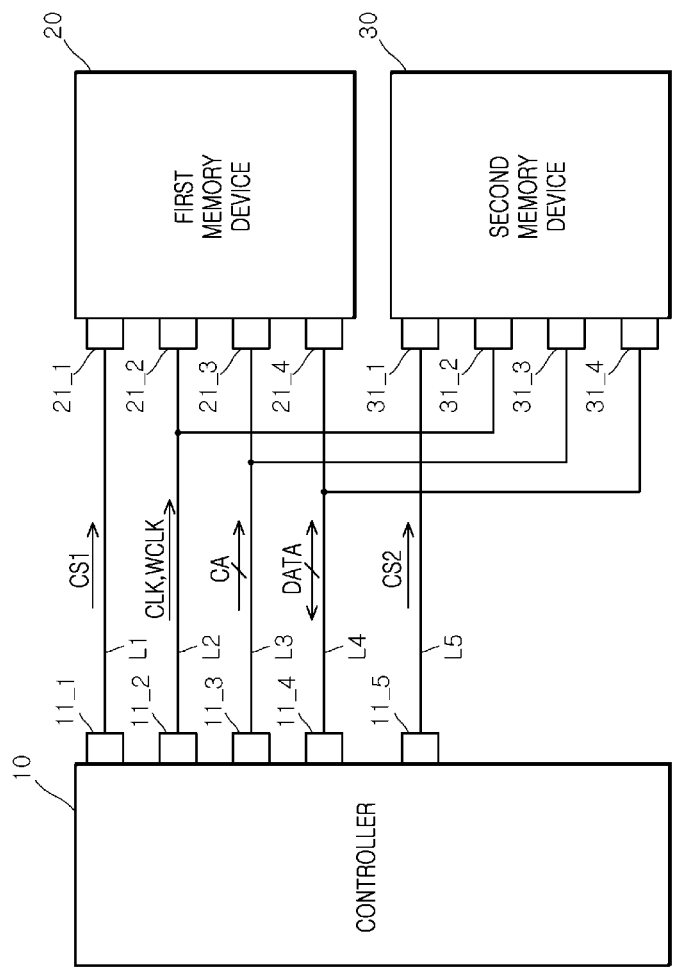
FIG. 1 is a block diagram illustrating a configuration of a semiconductor system according to an embodiment of the present disclosure.

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the present disclosure will be described in more detail through embodiments. The embodiments are only used to exemplify the present disclosure, and the scope of the present disclosure is not limited by the embodiments.

An embodiment of the present disclosure may provide a semiconductor system, which maintains a clock synchronization operation when a second normal operation is performed before a first normal operation is completed after the clock synchronization operation.

Furthermore, an embodiment of the present disclosure may provide a semiconductor system, which maintains a clock synchronization operation when a data clock extension operation is performed before a normal operation is completed after the clock synchronization operation.

Furthermore, an embodiment of the present disclosure may provide a semiconductor system, which maintains a clock synchronization operation when a data clock extension operation is performed before a normal operation of any one of multiple memory devices is completed.

According to an embodiment of the present disclosure, a clock synchronization operation can be maintained when a second normal operation is performed before a first normal operation is completed after the clock synchronization operation is performed.

Furthermore, according to an embodiment of the present disclosure, it is possible to reduce current consumption because a data clock is not generated again by maintaining a clock synchronization operation when a second normal operation is performed before a first normal operation is completed after the clock synchronization operation is performed.

Furthermore, an embodiment of the present disclosure has an effect in that a clock synchronization operation can be maintained when a data clock extension operation is performed before a normal operation is completed after the clock synchronization operation is performed.

Furthermore, according to an embodiment of the present disclosure, current consumption can be reduced because a data clock is not generated again by maintaining a clock synchronization operation when a data clock extension operation is performed before a normal operation is completed after a clock synchronization operation is performed.

Furthermore, an embodiment of the present disclosure has an effect in that a clock synchronization operation can be maintained when a data clock extension operation is performed before a normal operation of any one of multiple memory devices is completed.

Furthermore, according to an embodiment of the present disclosure, current consumption can be reduced because a data clock is not generated again by maintaining a clock synchronization operation when a data clock extension operation is performed before a normal operation of any one of multiple memory devices is completed.

As illustrated in FIG. 1, a semiconductor system 1 according to an embodiment of the present disclosure may include a controller 10, a first memory device 20, and a second memory device 30.

The controller 10 may include a first control pin 11_1, a second control pin 11_2, a third control pin 11_3, a fourth control pin 11_4, and a fifth control pin 11_5. The first memory device 20 may include a first device pin 21_1, a second device pin 21_2, a third device pin 21_3, and a fourth device pin 21_4. The second memory device 30 may include a fifth device pin 31_1, a sixth device pin 31_2, a seventh device pin 31_3, and an eighth device pin 31_4.

The controller 10 may transmit a first chip selection signal CS1 to the first memory device 20 through a first transmission line L1 that is connected between the first control pin 11_1 and the first device pin 21_1. The controller 10 may transmit a clock CLK and a data clock WCLK to the first memory device 20 through a second transmission line L2 that is connected between the second control pin 11_2 and the second device pin 21_2. The controller 10 may transmit the clock CLK and the data clock WCLK to the second memory device 30 through the second transmission line L2 that is connected between the second control pin 11_2 and the sixth device pin 31_2. The first memory device 20 and the second memory device 30 may receive the clock CLK and the data clock WCLK by sharing the second transmission line L2. The clock CLK and the data clock WCLK have been illustrated as being output through the second transmission line L2, but may be output through different transmission lines. The clock CLK may be set as a signal that is periodically toggled in order to latch a command address CA. The data clock WCLK may be set as a signal that is periodically toggled in order to latch data DATA. The data clock WCLK may be set as a signal having a frequency that is 2N times the clock CLK. "N" may be set as a natural number. The data clock WCLK may be set as a signal having a frequency that is an even multiple of the frequency of the clock CLK. The controller 10 may transmit the command address CA to the first memory device 20 through a third transmission line L3 that is connected between the third control pin 11_3 and the third device pin 21_3. The controller 10 may transmit the command address CA to the second memory device 30 through the third transmission line L3 that is connected between the third control pin 11_3 and the seventh device pin 31_3. The first memory device 20 and the second memory device 30 may receive the command address CA by sharing the third transmission line L3. The command address CA may be set to include multiple bits. Each of the third control pin 11_3, the third device pin 21_3, the seventh device pin 31_3, and the third transmission line L3 may be implemented in multiple numbers depending on the number of bits of the command address CA. The controller 10 may output the data DATA to the first memory device 20 or receive the data DATA from the first memory device 20 through a fourth transmission line L4 that is connected between the fourth control pin 11_4 and the fourth device pin 21_4. The controller 10 may output the data DATA to the second memory device 30 or receive the data DATA from the second memory device 30 through the fourth transmission line L4 that is connected between the fourth control pin 11_4 and the eighth device pin 31_4. The first memory device 20 and the second memory device 30 may receive and output the data DATA by sharing the fourth transmission line L4. The data DATA may be set to include multiple bits. Each of the fourth control pin 11_4, the fourth device pin 21_4, the eighth device pin 31_4, and the fourth transmission line L4 may be implemented in multiple numbers depending on the number of bits of the data DATA. The controller 10 may transmit a second chip selection signal CS2 to the second memory device 30 through a fifth transmission line L5 that is connected between the fifth control pin 11_5 and the fifth device pin 31_1.

The controller 10 may output, to the first memory device 20 and the second memory device 30, the first chip selection signal CS1 and the second chip selection signal CS2 for selectively controlling the first memory device 20 and the second memory device 30. The controller 10 may output, to the first memory device 20 and the second memory device 30, the clock CLK and the data clock WCLK for synchronizing operations of the first memory device 20 and the second memory device 30. The controller 10 may output, to the first memory device 20 and the second memory device 30, the command address CA for controlling normal operations of the first memory device 20 and the second memory device 30. The controller 10 may output, to the first memory device 20 and the second memory device 30, the command address CA for controlling a clock synchronization operation in the normal operations of the first memory device 20 and the second memory device 30. The controller 10 may output, to the first memory device 20 and the second memory device 30, the command address CA for controlling a data clock extension operation in the normal operations of the first memory device 20 and the second memory device 30. The controller 10 may output the data DATA to the first memory device 20 and the second memory device 30 after the start of a write operation of the normal operation. The controller 10 may receive the data DATA from the first memory device 20 and the second memory device 30 after the start of a read operation of the normal operation.

The first memory device 20 may receive the command address CA in synchronization with the clock CLK when the first chip selection signal CS1 is enabled. The first memory device 20 may receive the data DATA in synchronization with the data clock WCLK after the start of a write operation of a normal operation by the command address CA. The first memory device 20 may output the data DATA in synchronization with the data clock WCLK after the start of a read operation of the normal operation by the command address CA. The first memory device 20 may extend an interval for receiving the data clock WCLK in the normal operation by the command address CA.

The second memory device 30 may receive the command address CA in synchronization with the clock CLK when the second chip selection signal CS2 is enabled. The second memory device 30 may receive the data DATA in synchronization with the data clock WCLK after the start of a write operation of a normal operation by the command address CA. The second memory device 30 may output the data DATA in synchronization with the data clock WCLK after the start of a read operation of the normal operation by the command address CA. The second memory device 30 may extend an interval for receiving the data clock WCLK in the normal operation by the command address CA.

Since the first memory device 20 and the second memory device 30 share the fourth transmission line L4 through which the data DATA are input and output, the first memory device 20 and the second memory device 30 may perform a write operation and a read operation at different pieces of timing.

Figure 2:
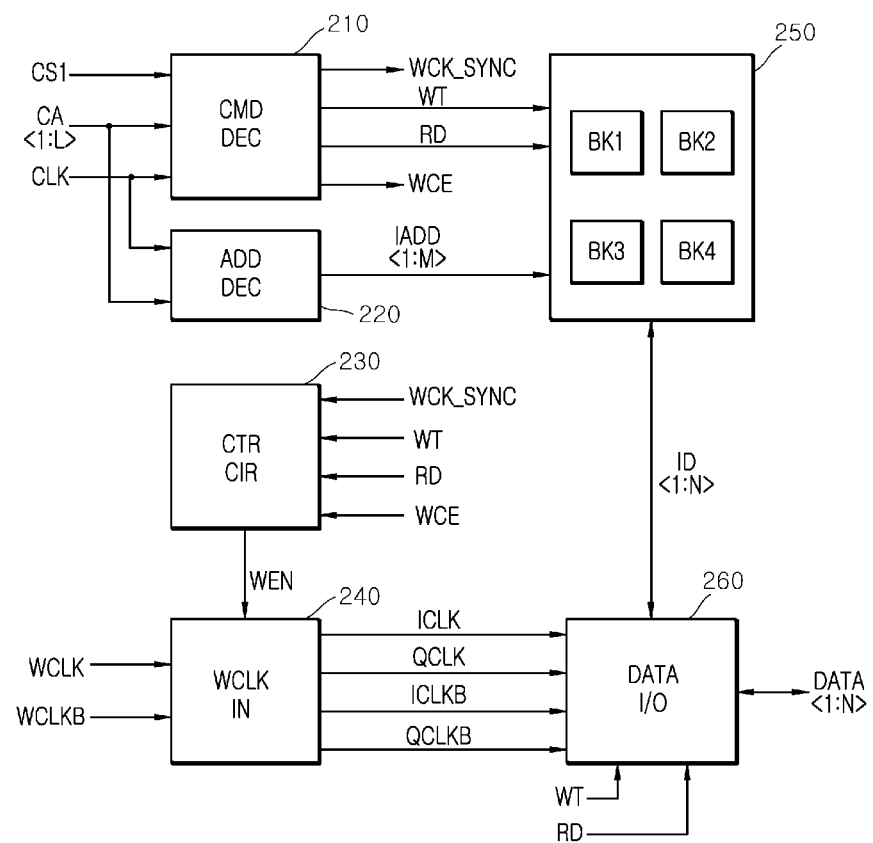
FIG. 2 is a block diagram illustrating a configuration according to an embodiment of a first memory device that is included in the semiconductor system illustrated in FIG. 1.

FIG. 2 is a block diagram illustrating a configuration according to an embodiment of the first memory device 20 that is included in the semiconductor system 1. The first memory device 20 may include a command decoder (CMD DEC) 210, an address decoder (ADD DEC) 220, a control circuit (CTR CIR) 230, a data clock input circuit (WCLK IN) 240, a memory region 250, and a data input and output circuit (DATA I/O) 260.

The command decoder 210 may generate a data clock input control signal WCK_SYNC, a write signal WT, a read signal RD, and a synchronization signal WCE by decoding first to L-th command addresses CA<1:L> when the first chip selection signal CS1 is enabled. The command decoder 210 may generate the data clock input control signal WCK_SYNC that is enabled if the first to L-th command addresses CA<1:L> that are input in synchronization with the clock CLK when the first chip selection signal CS1 is enabled have a logic level combination for performing a clock synchronization operation. The data clock input control signal WCK_SYNC may be set as a column address strobe (CAS) signal for performing a column operation in a common memory device. The command decoder 210 may generate the write signal WT that is enabled if the first to L-th command addresses CA<1:L> that are input in synchronization with the clock CLK when the first chip selection signal CS1 is enabled have a logic level combination for performing a write operation of a normal operation. The command decoder 210 may generate the read signal RD that is enabled if the first to L-th command addresses CA<1:L> that are input in synchronization with the clock CLK when the first chip selection signal CS1 is enabled have a logic level combination for performing a read operation of the normal operation. The command decoder 210 may generate the synchronization signal WCE that is enabled if the first to L-th command addresses CA<1:L> that are input in synchronization with the clock CLK during the normal operation when the first chip selection signal CS1 is enabled have a logic level combination for performing a data clock extension operation. The number "L" of bits of the first to L-th command addresses CA<1:L> may be set as various numbers in an embodiment. The number "L" of bits of the first to L-th command addresses CA<1:L> may be set as a natural number.

The address decoder 220 may generate first to M-th internal addresses IADD<1:M> by decoding the first to L-th command addresses CA<1:L> that are input in synchronization with the clock CLK. The number "M" of bits of the first to M-th internal addresses IADD<1:M> may be set as various numbers in an embodiment. The number "M" of bits of the first to M-th internal addresses IADD<1:M> may be set as a natural number.

The control circuit 230 may generate the sync enable signal WEN based on the data clock input control signal WCK_SYNC, the write signal WT, the read signal RD, and the synchronization signal WCE. The control circuit 230 may generate the sync enable signal WEN that is enabled at timing at which the data clock input control signal WCK_SYNC is enabled in a normal operation. The control circuit 230 may generate the sync enable signal WEN that is disabled after a set interval from timing at which the write signal WT and the read signal RD are enabled in the normal operation. The control circuit 230 may generate the sync enable signal WEN the disable timing of which is delayed when the synchronization signal WCE is input before the last write signal WT and the last read signal RD are input while the write signal WT and the read signal RD are continuously input in the normal operation. The control circuit 230 may generate the sync enable signal WEN that is enabled during the intervals of a write operation and read operation of the normal operation. The control circuit 230 may extend an interval in which the sync enable signal WEN is enabled when the synchronization signal WCE is input before the write operation and the read operation are completed.

The data clock input circuit 240 may receive the data clock WCLK and an inverted data clock WCLKB when the sync enable signal WEN is enabled. The data clock input circuit 240 may generate a first internal clock ICLK, a second internal clock QCLK, a third internal clock ICLKB, and a fourth internal clock QCLKB by dividing the frequencies of the data clock WCLK and the inverted data clock WCLKB that have been received when the sync enable signal WEN is enabled. The data clock input circuit 240 may generate the first internal clock ICLK, the second internal clock QCLK, the third internal clock ICLKB, and the fourth internal clock QCLKB having different phases by dividing the frequencies of the data clock WCLK and the inverted data clock WCLKB that have been received when the sync enable signal WEN is enabled.

The memory region 250 may include a first bank BK1, a second bank BK2, a third bank BK3, and a fourth bank BK4. The memory region 250 may store first to N-th internal data ID<1:N> after the start of a write operation of a normal operation. The memory region 250 may store the first to N-th internal data ID<1:N> in any one of the first bank BK1, the second bank BK2, the third bank BK3, and the fourth bank BK4, which is selected by the first to M-th internal addresses IADD<1:M>, when the write signal WT is enabled. The memory region 250 may output the first to N-th internal data ID<1:N> that have been stored in any one of the first bank BK1, the second bank BK2, the third bank BK3, and the fourth bank BK4 after the start of a read operation of the normal operation. The memory region 250 may output the first to N-th internal data ID<1:N> that have been stored in any one of the first bank BK1, the second bank BK2, the third bank BK3, and the fourth bank BK4, which is selected by the first to M-th internal addresses IADD<1:M>, when the read signal RD is enabled. The memory region 250 has been implemented to include the four banks, but may be implemented to include various numbers of banks in an embodiment. Each of the first bank BK1, the second bank BK2, the third bank BK3, and the fourth bank BK4 may be implemented as a common bank that includes multiple memory cells (not illustrated) and that stores and outputs data.

The data input and output circuit 260 may generate the first to N-th internal data ID<1:N> by receiving first to N-th data DATA<1:N> that are input from the controller 10 after the start of a write operation of a normal operation. The data input and output circuit 260 may receive the first to N-th data DATA<1:N> in synchronization with the first internal clock ICLK, the second internal clock QCLK, the third internal clock ICLKB, and the fourth internal clock QCLKB when the write signal WT is enabled, and may generate the first to N-th internal data ID<1:N> from the received first to N-th data DATA<1:N>. The data input and output circuit 260 may output the first to N-th internal data ID<1:N> to the memory region 250 when the write signal WT is enabled. The data input and output circuit 260 may generate the first to N-th data DATA<1:N> by receiving the first to N-th internal data ID<1:N> that are received from the memory region 250 after the start of a read operation of the normal operation. The data input and output circuit 260 may receive the first to N-th internal data ID<1:N> in synchronization with the first internal clock ICLK, the second internal clock QCLK, the third internal clock ICLKB, and the fourth internal clock QCLKB when the read signal RD is enabled, and may generate the first to N-th data DATA<1:N> from the received first to N-th internal data ID<1:N>. The data input and output circuit 260 may output the first to N-th data DATA<1:N> to the controller 10 when the read signal RD is enabled. The number "N" of bits of the first to N-th internal data ID<1:N> may be set as various numbers in an embodiment. The number "N" of bits of the first to N-th internal data ID<1:N> may be set as a natural number. The number "N" of bits of the first to N-th data DATA<1:N> may be set as various numbers in an embodiment. The number "N" of bits of the first to N-th data DATA<1:N> may be set as a natural number.

The second memory device 30 illustrated in FIG. 1 may be implemented to have the same configuration as the first memory device 20 illustrated in FIG. 2 and may perform the same operation as the first memory device 20 except that the second memory device 30 is selected by a second chip selection signal CS2 and performs an operation, and a detailed description of the second memory device 30 is omitted.

Figure 3:
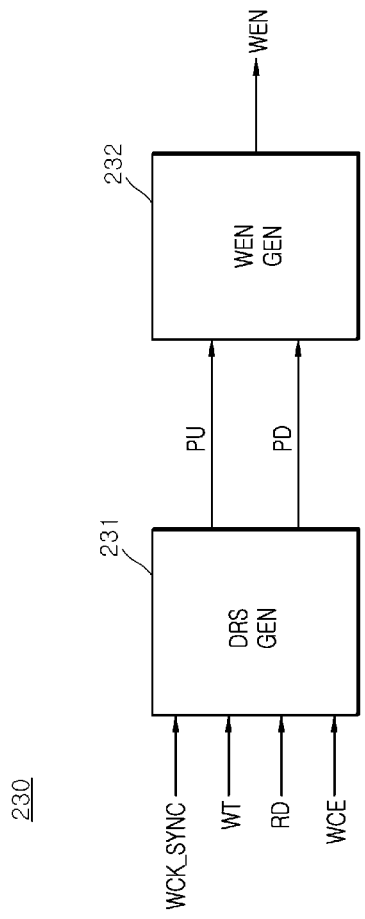
FIG. 3 is a block diagram illustrating a configuration according to an embodiment of a control circuit that is included in the first memory device illustrated in FIG. 2.

FIG. 3 is a block diagram illustrating a configuration according to an embodiment of the control circuit 230 that is included in the first memory device 20. The control circuit 230 may include a driving signal generation circuit (DRS GEN) 231 and a sync enable signal generation circuit (WEN GEN) 232.

The driving signal generation circuit 231 may generate a pull-up driving signal PU and a pull-down driving signal PD, based on the data clock input control signal WCK_SYNC, the write signal WT, the read signal RD, and the synchronization signal WCE. The driving signal generation circuit 231 may generate the pull-up driving signal PU that is enabled when the data clock input control signal WCK_SYNC is enabled. The driving signal generation circuit 231 may generate the pull-down driving signal PD that is enabled after any one of the write signal WT and the read signal RD is enabled. The driving signal generation circuit 231 may generate the pull-down driving signal PD the enable timing of which is delayed when the synchronization signal WCE is enabled before any one of the write signal WT and the read signal RD is enabled. The driving signal generation circuit 231 may generate the pull-up driving signal PU that is enabled when the data clock input control signal WCK_SYNC is input in a normal operation. The driving signal generation circuit 231 may generate the pull-down driving signal PD that is enabled when any one of the write signal WT and the read signal RD is input or that is enabled after a set interval when the synchronization signal WCE is input. The driving signal generation circuit 231 may generate the pull-down driving signal PD that is enabled when any one of the write signal WT and the read signal RD is input. The driving signal generation circuit 231 may generate the pull-down driving signal PD that is enabled after a set interval by blocking the input of the write signal WT and the read signal RD when the synchronization signal WCE is input. The driving signal generation circuit 231 may generate the pull-down driving signal PD that is enabled when any one of the write signal WT, the read signal RD, and the synchronization signal WCE is input. The driving signal generation circuit 231 may generate the pull-down driving signal PD that is enabled based on the write signal WT, the read signal RD, and a flag signal (FLAG in FIG. 18). The driving signal generation circuit 231 may delay timing at which the pull-down driving signal PD is enabled when the flag signal (FLAG in FIG. 18) is input. The pull-up driving signal PU may be set as a signal that is enabled at a logic low level. The pull-down driving signal PD may be set as a signal that is enabled at a logic high level.

The sync enable signal generation circuit 232 may generate the sync enable signal WEN based on the pull-up driving signal PU and the pull-down driving signal PD. The sync enable signal generation circuit 232 may generate the sync enable signal WEN that is enabled at timing at which the pull-up driving signal PU is enabled. The sync enable signal generation circuit 232 may generate the sync enable signal WEN that is disabled at timing at which the pull-down driving signal PD is enabled.

Figure 4:
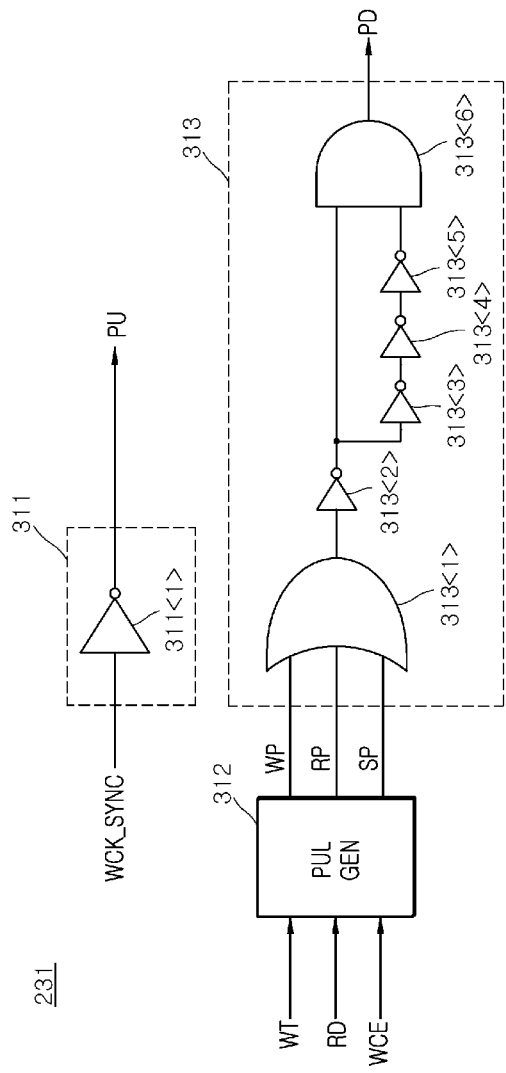
FIG. 4 is a diagram illustrating a configuration according to an embodiment of a driving signal generation circuit that is included in the control circuit illustrated in FIG. 3.

FIG. 4 is a diagram illustrating a configuration according to an embodiment of the driving signal generation circuit 231 that is included in the control circuit 230. The driving signal generation circuit 231 may include a pull-up driving signal generation circuit 311, a pulse generation circuit (PUL GEN) 312, and a pull-down driving signal generation circuit 313.

The pull-up driving signal generation circuit 311 may be implemented as an inverter 311<1>. The pull-up driving signal generation circuit 311 may generate the pull-up driving signal PU by inverting and buffering the data clock input control signal WCK_SYNC. The pull-up driving signal generation circuit 311 may generate the pull-up driving signal PU that is enabled at a logic low level when the data clock input control signal WCK_SYNC is enabled at a logic high level.

The pulse generation circuit 312 may generate a write pulse WP, a read pulse RP, and a synchronization pulse SP, based on the write signal WT, the read signal RD, and the synchronization signal WCE. The pulse generation circuit 312 may generate the write pulse WP that is disabled after the time that is taken for all of the first to N-th data DATA<1:N> to be input from timing at which the write signal WT is enabled. The pulse generation circuit 312 may generate the read pulse RP that is disabled after the time that is taken for all of the first to N-th data DATA<1:N> to be output from timing at which the read signal RD is enabled. The pulse generation circuit 312 may generate the synchronization pulse SP that is disabled after a set interval from timing at which the synchronization signal WCE is enabled. The set interval in which the synchronization pulse SP is disabled may be variously set in an embodiment.

The pull-down driving signal generation circuit 313 may be implemented by using an OR gate 313<1>, inverters 313<2>, 313<3>, 313<4>, and 313<5>, and an AND gate 313<6>. The pull-down driving signal generation circuit 313 may generate the pull-down driving signal PD, based on the write pulse WP, the read pulse RP, and the synchronization pulse SP. The pull-down driving signal generation circuit 313 may generate the pull-down driving signal PD that is enabled at a logic high level when the write pulse WP is disabled from a logic high level to a logic low level. The pull-down driving signal generation circuit 313 may generate the pull-down driving signal PD that is enabled at a logic high level when the read pulse RP is disabled from a logic high level to a logic low level. The pull-down driving signal generation circuit 313 may generate the pull-down driving signal PD that is enabled at a logic high level when the synchronization pulse SP is disabled from a logic high level to a logic low level.

Figure 5:
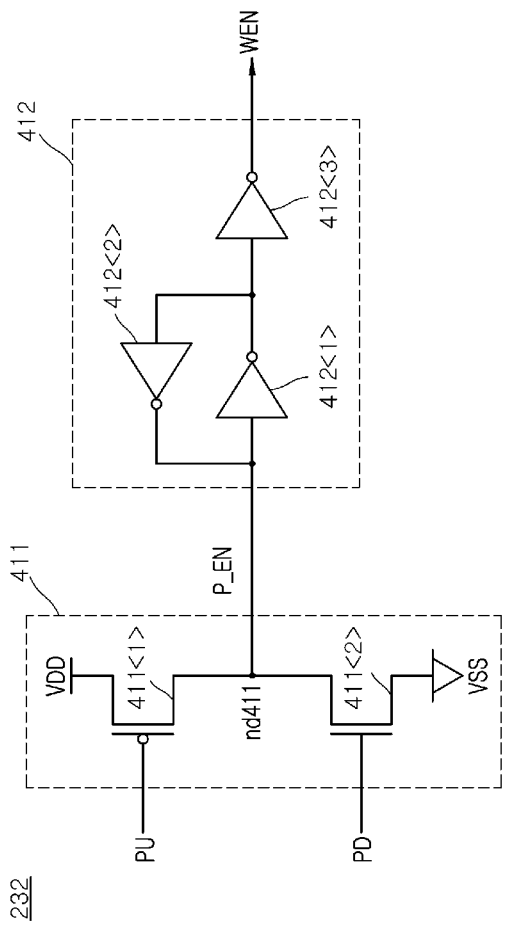
FIG. 5 is a circuit diagram illustrating a configuration according to an embodiment of a sync enable signal generation circuit that is included in the control circuit illustrated in FIG. 3.

FIG. 5 is a circuit diagram illustrating a configuration according to an embodiment of the sync enable signal generation circuit 232 that is included in the control circuit

230. The sync enable signal generation circuit 232 may include a pre-enable signal generation circuit 411 and a latch circuit 412.

The pre-enable signal generation circuit 411 may be implemented by using a PMOS transistor 411<1> that is connected between a source voltage VDD and a node nd411 and that is turned on by the pull-up driving signal PU and an NMOS transistor 411<2> that is connected between the node nd411 and a ground voltage VSS and that is turned on by the pull-down driving signal PD. The pre-enable signal generation circuit 411 may generate a pre-enable signal P_EN having a logic high level when the pull-up driving signal PU is enabled at a logic low level. The pre-enable signal generation circuit 411 may generate the pre-enable signal P_EN having a logic low level when the pull-down driving signal PD is enabled at a logic high level.

The latch circuit 412 may be implemented by using inverters 412<1>, 412<2>, and 412<3>. The latch circuit 412 may latch the pre-enable signal P_EN. The latch circuit 412 may generate the sync enable signal WEN by buffering the latched pre-enable signal P_EN.

Figure 6:
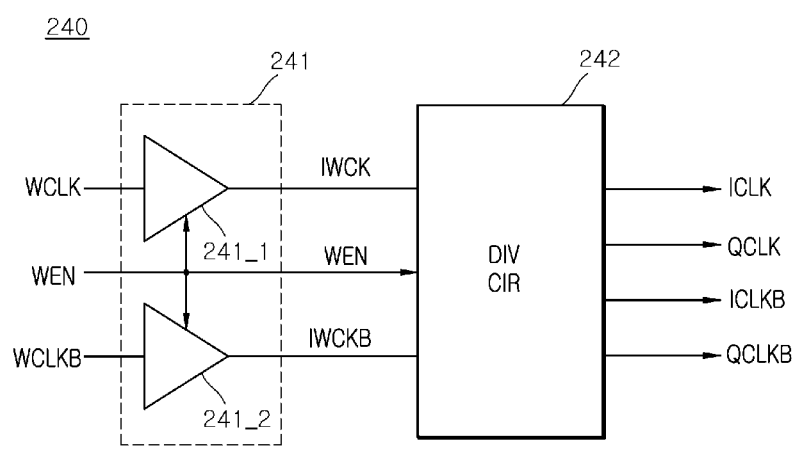
FIG. 6 is a block diagram illustrating a configuration according to an embodiment of a data clock input circuit that is included in the first memory device illustrated in FIG. 2.

FIG. 6 is a block diagram illustrating a configuration according to an embodiment of the data clock input circuit 240 that is included in the first memory device 20. The data clock input circuit 240 may include an input buffer circuit 241 and a frequency division circuit (DIV CIR) 242.

The input buffer circuit 241 may include a first input buffer 241_1 and a second input buffer 241_2. The first input buffer 241_1 may be turned on during the interval in which the sync enable signal WEN is enabled, and may generate the input clock IWCK by buffering the data clock WCLK. The second input buffer 241_2 may be turned on during the interval in which the sync enable signal WEN is enabled, and may generate the inverted input clock IWCKB by buffering the inverted data clock WCLKB. The input buffer circuit 241 may generate the input clock IWCK and the inverted input clock IWCKB by buffering the data clock WCLK and the inverted data clock WCLKB during the interval in which the sync enable signal WEN is enabled.

The frequency division circuit 242 may generate the first internal clock ICLK, the second internal clock QCLK, the third internal clock ICLKB, and the fourth internal clock QCLKB by dividing the frequencies of the input clock IWCK and the inverted input clock IWCKB during the interval in which the sync enable signal WEN is enabled. The frequency division circuit 242 may generate the first internal clock ICLK, the second internal clock QCLK, the third internal clock ICLKB, and the fourth internal clock QCLKB having different phases by dividing the frequencies of the input clock IWCK and the inverted input clock IWCKB during the interval in which the sync enable signal WEN is enabled.

Figure 7:
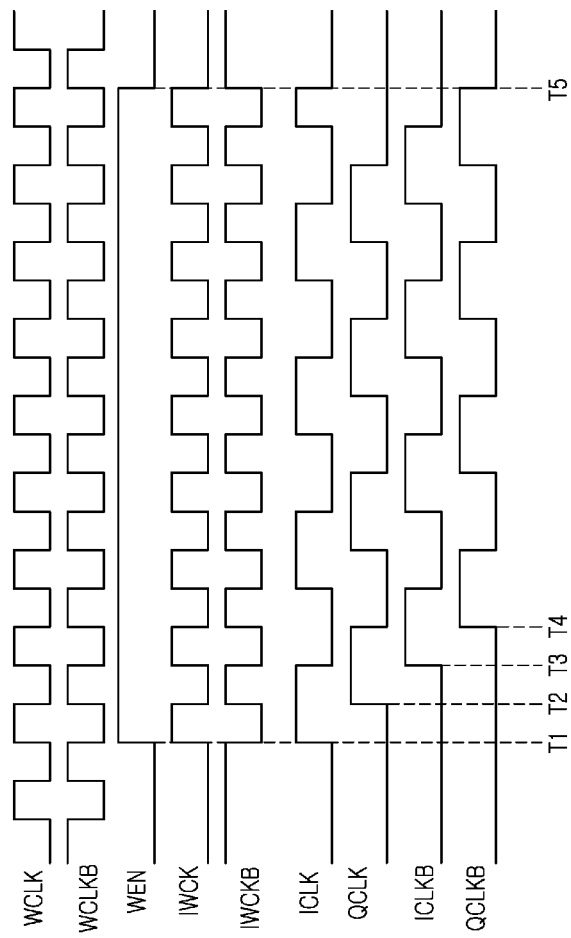
FIG. 7 is a timing diagram for describing an operation of the data clock input circuit illustrated in FIG. 6.

An operation of generating, by the data clock input circuit 240, the first internal clock ICLK, the second internal clock QCLK, the third internal clock ICLKB, and the fourth internal clock QCLKB from the data clock WCLK and the inverted data clock WCLKB is described in detail with reference to FIG. 7.

The operation of generating, by the data clock input circuit 240 according to an embodiment of the present disclosure, the first internal clock ICLK, the second internal clock QCLK, the third internal clock ICLKB, and the fourth internal clock QCLKB from the data clock WCLK and the inverted data clock WCLKB is described as follows with reference to FIG. 7.

Prior to a description, the inverted data clock WCLKB may be an inverted signal of the data clock WCLK.

The sync enable signal WEN may be enabled at a logic high level from timing T1 to timing T5.

From timing T1 to timing T5, the first input buffer 241_1 may be turned on during the interval in which the sync enable signal WEN is enabled at a logic high level, and may generate the input clock IWCK by buffering the data clock WCLK. The second input buffer 241_2 may be turned on during the interval in which the sync enable signal WEN is enabled at a logic high level, and may generate the inverted input clock IWCKB by buffering the inverted data clock WCLKB.

At timing T1, the frequency division circuit 242 may generate the first internal clock ICLK that includes a pulse having a logic high level by dividing the frequencies of the input clock IWCK and the inverted input clock IWCKB during the interval in which the sync enable signal WEN is enabled. The pulse width of the first internal clock ICLK may be generated as one cycle interval of the data clock WCLK. The first internal clock ICLK may be generated to have half the frequency of the data clock WCLK.

At timing T2, the frequency division circuit 242 may generate the second internal clock QCLK that includes a pulse having a logic high level by dividing the frequencies of the input clock IWCK and the inverted input clock IWCKB during the interval in which the sync enable signal WEN is enabled. The pulse width of the second internal clock QCLK may be generated as one cycle interval of the data clock WCLK. The second internal clock QCLK may be generated to have half the frequency of the data clock WCLK.

At timing T3, the frequency division circuit 242 may generate the third internal clock ICLKB that includes a pulse having a logic high level by dividing the frequencies of the input clock IWCK and the inverted input clock IWCKB during the interval in which the sync enable signal WEN is enabled. The pulse width of the third internal clock ICLKB may be generated as one cycle interval of the data clock WCLK. The third internal clock ICLKB may be generated to have half the frequency of the data clock WCLK.

At timing T4, the frequency division circuit 242 may generate the fourth internal clock QCLKB that includes a pulse having a logic high level by dividing the frequencies of the input clock IWCK and the inverted input clock IWCKB during the interval in which the sync enable signal WEN is enabled. The pulse width of the fourth internal clock QCLKB may be generated as one cycle interval of the data clock WCLK. The fourth internal clock QCLKB may be generated to have half the frequency of the data clock WCLK.

From timing T1 to timing T5, the data clock input circuit 240 may generate the first internal clock ICLK, the second internal clock QCLK, the third internal clock ICLKB, and the fourth internal clock QCLKB having different phases by dividing the frequencies of the input clock IWCK and the inverted input clock IWCKB. The second internal clock QCLK may be generated to have a phase which is later than the phase of the first internal clock ICLK by a half cycle interval of the data clock WCLK. The third internal clock ICLKB may be generated to have a phase which is later than the phase of the second internal clock QCLK by the half cycle interval of the data clock WCLK. The fourth internal clock QCLKB may be generated to have a phase which is later than the phase of the third internal clock ICLKB by the half cycle interval of the data clock WCLK.

Figure 8:
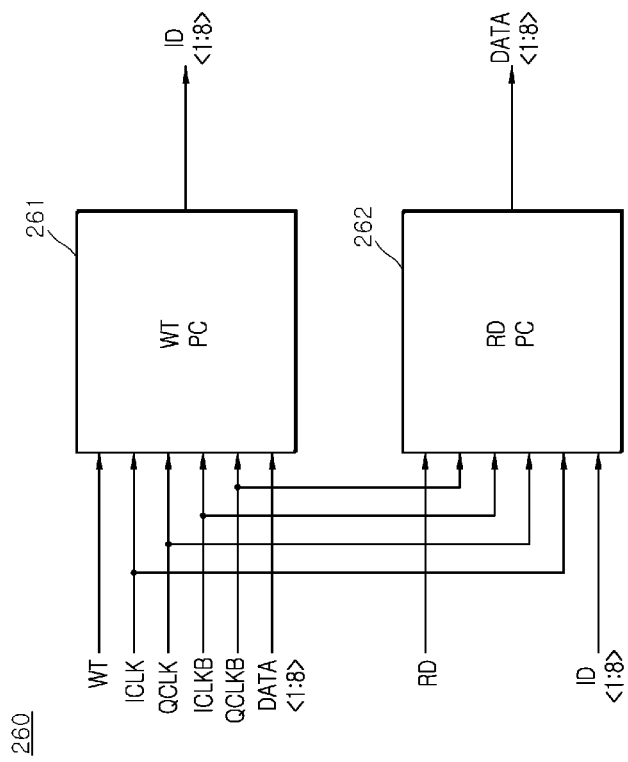
FIG. 8 is a block diagram illustrating a configuration according to an embodiment of a data input and output circuit that is included in the first memory device illustrated in FIG. 2.

FIG. 8 is a block diagram illustrating a configuration according to an embodiment of the data input and output circuit 260 that is included in the first memory device 20.

The data input and output circuit 260 may include a write processing circuit (WT PC) 261 and a read processing circuit (RD PC) 262.

The write processing circuit 261 may latch the first to eighth data DATA<1:8> that are input from the controller 10, in synchronization with the first internal clock ICLK, the second internal clock QCLK, the third internal clock ICLKB, and the fourth internal clock QCLKB when the write signal WT is enabled. The write processing circuit 261 may generate the first to eighth internal data ID<1:8> from the first to eighth data DATA<1:8> that have been latched in synchronization with the first internal clock ICLK, the second internal clock QCLK, the third internal clock ICLKB, and the fourth internal clock QCLKB when the write signal WT is enabled. The write processing circuit 261 may output the first to eighth internal data ID<1:8> to the memory region 250 when the write signal WT is enabled.

The read processing circuit 262 may latch the first to eighth internal data ID<1:8> that are input from the memory region 250, in synchronization with the first internal clock ICLK, the second internal clock QCLK, the third internal clock ICLKB, and the fourth internal clock QCLKB when the read signal RD is enabled. The read processing circuit 262 may generate the first to eighth data DATA<1:8> from the first to eighth internal data ID<1:8> that have been latched in synchronization with the first internal clock ICLK, the second internal clock QCLK, the third internal clock ICLKB, and the fourth internal clock QCLKB when the read signal RD is enabled. The read processing circuit 262 may output the first to eighth data DATA<1:8> to the controller 10 when the read signal RD is enabled.

The data input and output circuit 260 illustrated in FIG. 8 has been illustrated as generating the first to eighth internal data ID<1:8> and the first to eighth data DATA<1:8> each having 8 bits, for convenience of description. However, in an embodiment, the data input and output circuit 260 may be implemented to generate internal data and data that include various bits.

Figure 9:
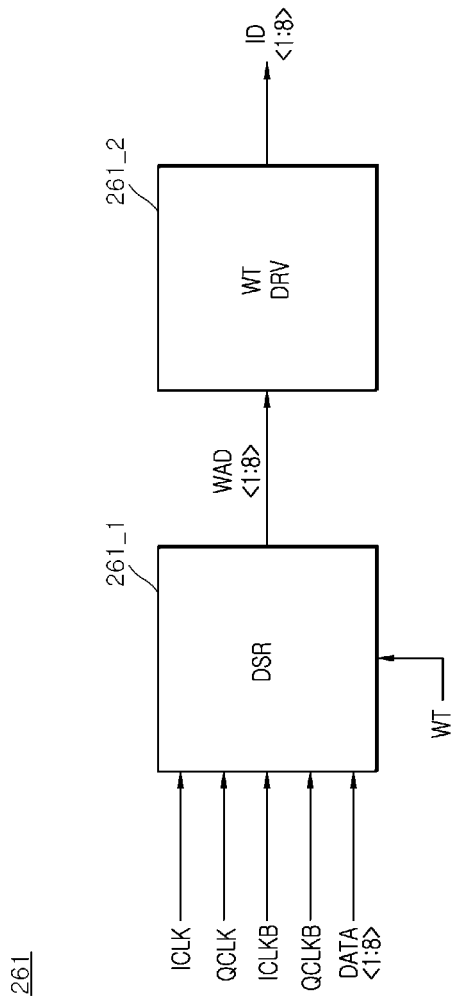
FIG. 9 is a block diagram illustrating a configuration according to an embodiment of a write processing circuit that is included in the data input and output circuit illustrated in FIG. 8.

FIG. 9 is a block diagram illustrating a configuration according to an embodiment of the write processing circuit 261 that is included in the data input and output circuit 260. The write processing circuit 261 may include a write alignment data generation circuit (DSR) 261_1 and a write driver (WT DRV) 261_2.

The write alignment data generation circuit 261_1 may latch the first to eighth data DATA<1:8> that are input in series from the controller 10, in synchronization with the first internal clock ICLK, the second internal clock QCLK, the third internal clock ICLKB, and the fourth internal clock QCLKB when the write signal WT is enabled. The write alignment data generation circuit 261_1 may generate first to eighth write alignment data WAD<1:8> by sequentially latching the first to eighth data DATA<1:8> and parallelizing the latched first to eighth data DATA<1:8>. The write alignment data generation circuit 261_1 may be implemented as a common deserializer.

The write driver 261_2 may generate the first to eighth internal data ID<1:8> based on the first to eighth write alignment data WAD<1:8>. The write driver 261_2 may output the first to eighth internal data ID<1:8> to the memory region 250.

Figure 10:
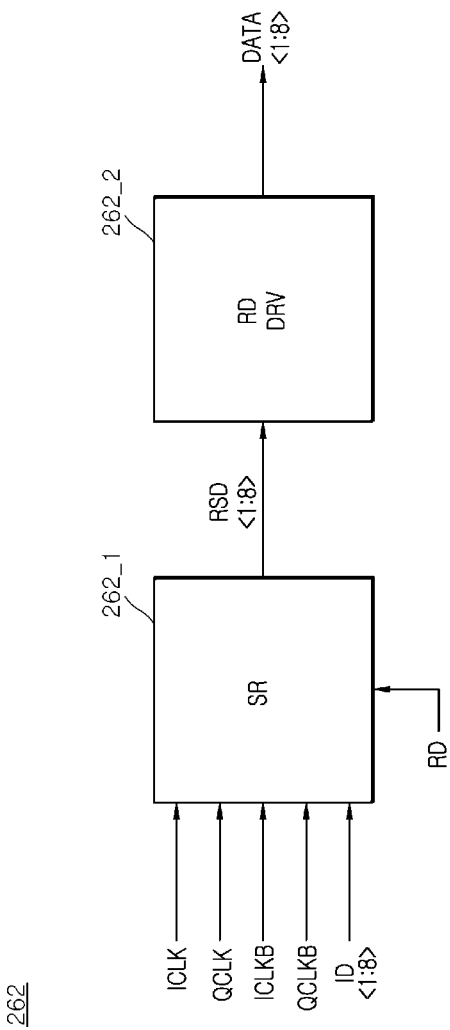
FIG. 10 is a block diagram illustrating a configuration according to an embodiment of a read processing circuit that is included in the data input and output circuit illustrated in FIG. 8.

FIG. 10 is a block diagram illustrating a configuration according to an embodiment of the read processing circuit 262 that is included in the data input and output circuit 260. The read processing circuit 262 may include a read serial data generation circuit (SR) 262_1 and a read driver (RD DRV) 262_2.

The read serial data generation circuit 262_1 may latch the first to eighth internal data ID<1:8> that are input in parallel from the memory region 250, in synchronization with the first internal clock ICLK, the second internal clock QCLK, the third internal clock ICLKB, and the fourth internal clock QCLKB when the read signal RD is enabled. The read serial data generation circuit 262_1 may generate first to eighth read serial data RSD<1:8> by latching the first to eighth internal data ID<1:8> and serializing the latched first to eighth internal data ID<1:8>. The read serial data generation circuit 262_1 may be implemented as a common serializer.

The read driver 262_2 may generate the first to eighth data DATA<1:8> based on the first to eighth read serial data RSD<1:8>. The read driver 262_2 may output the first to eighth data DATA<1:8> to the controller 10.

Figure 11:
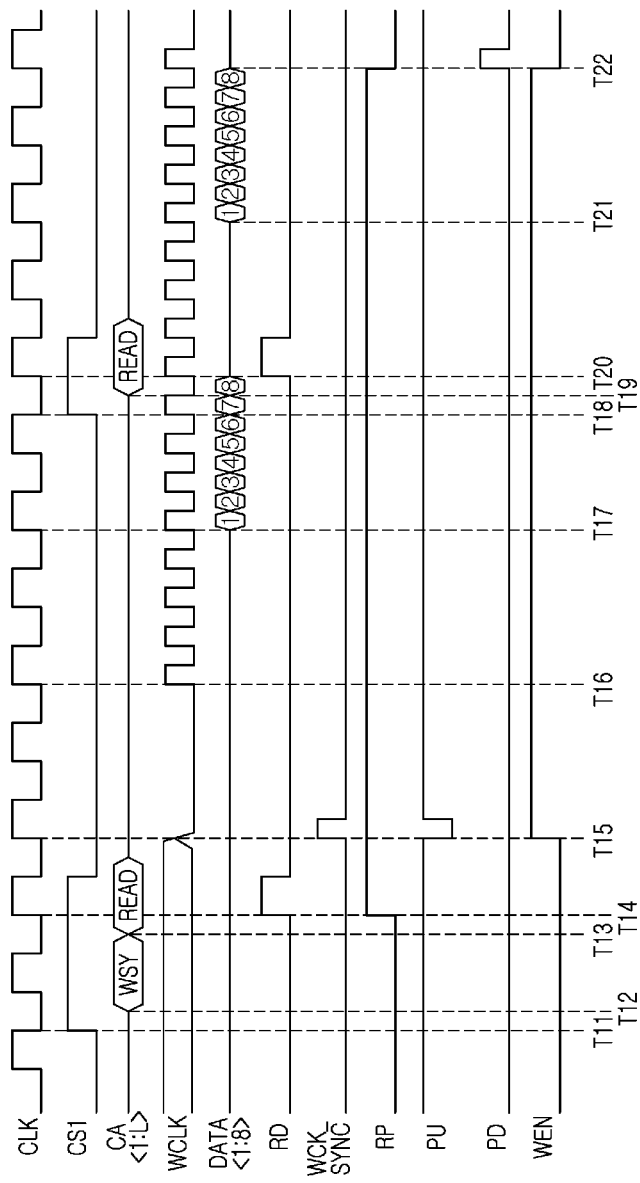
FIGS. 11, 12, and 13 are timing diagrams for describing an operation of the semiconductor system according to an embodiment of the present disclosure.

An operation of performing, by the semiconductor system 1 according to an embodiment of the present disclosure, a normal operation is described with reference to FIG. 11. In this case, an operation of performing, by the first memory device 20, a read operation after performing a clock synchronization operation is described as follows as an example.

At timing T11, the controller 10 may output, to the first memory device 20, the first chip selection signal CS1 for controlling the first memory device 20.

At timing T12, the controller 10 may output, to the first memory device 20, the first to L-th command addresses CA<1:L> for controlling a clock synchronization operation WSY of the first memory device 20.

At timing T13, the controller 10 may output, to the first memory device 20, the first to L-th command addresses CA<1:L> for controlling a read operation READ of a normal operation of the first memory device 20.

At timing T14, the command decoder 210 of the first memory device 20 may generate the read signal RD by decoding the first to L-th command addresses CA<1:L> when the first chip selection signal CS1 is enabled in synchronization with the clock CLK. The address decoder 220 of the first memory device 20 may generate the first to M-th internal addresses IADD<1:M> by decoding the first to L-th command addresses CA<1:L> that are input in synchronization with the clock CLK. The pulse generation circuit 312 of the control circuit 230 may generate the read pulse RP based on the read signal RD. The memory region 250 of the first memory device 20 may output the first to eighth internal data ID<1:8> that have been stored in any one of the first bank BK1, the second bank BK2, the third bank BK3, and the fourth bank BK4, which is selected by the first to M-th internal addresses IADD<1:M>, when the read signal RD is enabled.

At timing T15, the controller 10 may output, to the first memory device 20, the data clock WCLK having a logic level fixed to a logic low level.

The command decoder 210 of the first memory device 20 may generate the data clock input control signal WCK_SYNC by decoding the first to L-th command addresses CA<1:L> that have been input in order to control the clock synchronization operation WSY, when the first chip selection signal CS1 is enabled in synchronization with the clock CLK at timing T12. The driving signal generation circuit 231 of the control circuit 230 may generate the pull-up driving signal PU that is enabled at a logic low level when the data clock input control signal WCK_SYNC is enabled. The sync enable signal generation circuit 232 of the control circuit 230 may generate the sync enable signal WEN that is enabled at a logic high level at the timing at which the pull-up driving signal PU is enabled at a logic low level.

At timing T16, the controller 10 may output, to the first memory device 20, the data clock WCLK that is periodically toggled. Timing T15 to timing T16 may be set as an interval in which the logic level of the data clock WCLK is fixed to a logic low level before the data clock WCLK is toggled.

The data clock input circuit 240 of the first memory device 20 may receive the data clock WCLK and the inverted data clock WCLKB when the sync enable signal WEN is enabled at a logic high level. The data clock input circuit 240 of the first memory device 20 may generate the first internal clock ICLK, the second internal clock QCLK, the third internal clock ICLKB, and the fourth internal clock QCLKB by dividing the frequencies of the data clock WCLK and the inverted data clock WCLKB that have been received when the sync enable signal WEN is enabled at a logic high level.

At timing T17, the data input and output circuit 260 may receive the first to eighth internal data ID<1:8> in synchronization with the first internal clock ICLK, the second internal clock QCLK, the third internal clock ICLKB, and the fourth internal clock QCLKB, and may generate the first to eighth data DATA<1:8> from the received first to eighth internal data ID<1:8>. The first to eighth data DATA<1:8> may be generated in series. The data input and output circuit 260 may output the first to eighth data DATA<1:8> to the controller 10.

At timing T18, the controller 10 may output the first chip selection signal CS1 for controlling the first memory device 20 to the first memory device 20.

At timing T19, the controller 10 may output, to the first memory device 20, the first to L-th command addresses CA<1:L> for controlling a read operation READ of the normal operation of the first memory device 20.

At timing T20, the command decoder 210 of the first memory device 20 may generate the read signal RD by decoding the first to L-th command addresses CA<1:L> when the first chip selection signal CS1 is enabled in synchronization with the clock CLK. The address decoder 220 of the first memory device 20 may generate the first to M-th internal addresses IADD<1:M> by decoding the first to L-th command addresses CA<1:L> that are input in synchronization with the clock CLK. The pulse generation circuit 312 of the control circuit 230 may generate the read pulse RP based on the read signal RD. The memory region 250 of the first memory device 20 may output the first to eighth internal data ID<1:8> that have been stored in any one of the first bank BK1, the second bank BK2, the third bank BK3, and the fourth bank BK4, which is selected by the first to M-th internal addresses IADD<1:M>, when the read signal RD is enabled.

At timing T21, the data input and output circuit 260 may receive the first to eighth internal data ID<1:8> in synchronization with the first internal clock ICLK, the second internal clock QCLK, the third internal clock ICLKB, and the fourth internal clock QCLKB, and may generate the first to eighth data DATA<1:8> from the received first to eighth internal data ID<1:8>. The first to eighth data DATA<1:8> may be generated in series. The data input and output circuit 260 may output the first to eighth data DATA<1:8> to the controller 10.

At timing T22, the pulse generation circuit 312 of the control circuit 230 may generate the read pulse RP that is disabled at a logic low level after the time that is taken for all of the first to eighth data DATA<1:8> to be output from timing at which the read signal RD is enabled. The pull-down driving signal generation circuit 313 of the control circuit 230 may generate the pull-down driving signal PD that is enabled at a logic high level when the read pulse RP is disabled from a logic high level to a logic low level.

The sync enable signal generation circuit 232 of the control circuit 230 may generate the sync enable signal WEN that is disabled at a logic low level, at the timing at which the pull-down driving signal PD is enabled at a logic high level.

As described above, the semiconductor system 1 according to an embodiment of the present disclosure can maintain a clock synchronization operation when a second normal operation is performed before a first normal operation is completed after the clock synchronization operation is performed. In an embodiment, the semiconductor system 1 can reduce current consumption because the data clock WCLK is not generated again by maintaining the clock synchronization operation when the second normal operation is performed before the first normal operation is completed. The first normal operation and the second normal operation may mean normal operations that are sequentially performed in the same memory device. Furthermore, the first normal operation may mean a normal operation that is first performed in any one memory device among different memory devices, and the second normal operation may mean a normal operation that is performed in a different memory device after the first normal operation is performed.

Figure 12:
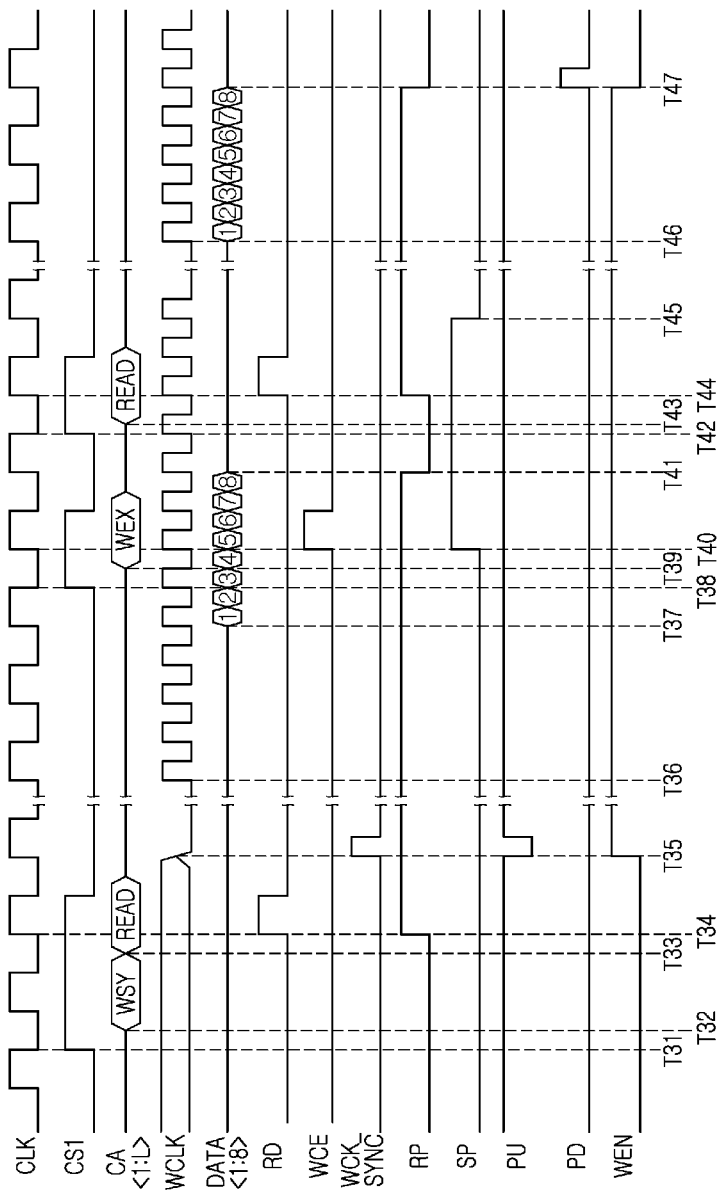

An operation of performing, by the semiconductor system 1 according to an embodiment of the present disclosure, a normal operation is described with reference to FIG. 12. In this case, an operation of performing, by the first memory device 20, a data clock extension operation before a read operation is completed after a clock synchronization operation is performed is described as follows as an example.

At timing T31, the controller 10 may output the first chip selection signal CS1 for controlling the first memory device 20 to the first memory device 20.

At timing T32, the controller 10 may output, to the first memory device 20, the first to L-th command addresses CA<1:L> for controlling a clock synchronization operation WSY of the first memory device 20.

At timing T33, the controller 10 may output, to the first memory device 20, the first to L-th command addresses CA<1:L> for controlling a read operation READ of a normal operation of the first memory device 20.

At timing T34, the command decoder 210 of the first memory device 20 may generate the read signal RD by decoding the first to L-th command addresses CA<1:L> in synchronization with the clock CLK when the first chip selection signal CS1 is enabled. The address decoder 220 of the first memory device 20 may generate the first to M-th internal addresses IADD<1:M> by decoding the first to L-th command addresses CA<1:L> that are input in synchronization with the clock CLK. The pulse generation circuit 312 of the control circuit 230 may generate the read pulse RP based on the read signal RD. The memory region 250 of the first memory device 20 may output the first to eighth internal data ID<1:8> that have been stored in any one of the first bank BK1, the second bank BK2, the third bank BK3, and the fourth bank BK4, which is selected by the first to M-th internal addresses IADD<1:M>, when the read signal RD is enabled.

At timing T35, the controller 10 may output, to the first memory device 20, the data clock WCLK having a logic level fixed to a logic low level.

The command decoder 210 of the first memory device 20 may generate the data clock input control signal WCK_SYNC by decoding the first to L-th command addresses CA<1:L> that have been input in order to control the clock synchronization operation WSY, when the first chip selection signal CS1 is enabled in synchronization with the clock CLK at timing T32. The driving signal generation circuit 231 of the control circuit 230 may generate the pull-up driving signal PU that is enabled at a logic low level when the data clock input control signal WCK_SYNC is enabled. The sync enable signal generation circuit 232 of the control circuit 230 may generate the sync enable signal WEN that is enabled at a logic high level at the timing at which the pull-up driving signal PU is enabled at a logic low level.

At timing T36, the controller 10 may output, to the first memory device 20, the data clock WCLK that is periodically toggled. Timing T35 to timing T36 may be set as an interval in which the logic level of the data clock WCLK is fixed to a logic low level before the data clock WCLK is toggled.

The data clock input circuit 240 of the first memory device 20 may receive the data clock WCLK and the inverted data clock WCLKB when the sync enable signal WEN is enabled at a logic high level. The data clock input circuit 240 of the first memory device 20 may generate the first internal clock ICLK, the second internal clock QCLK, the third internal clock ICLKB, and the fourth internal clock QCLKB by dividing the frequencies of the data clock WCLK and the inverted data clock WCLKB that have been received when the sync enable signal WEN is enabled at a logic high level.

At timing T37, the data input and output circuit 260 may receive the first to eighth internal data ID<1:8> in synchronization with the first internal clock ICLK, the second internal clock QCLK, the third internal clock ICLKB, and the fourth internal clock QCLKB, and may generate the first to eighth data DATA<1:8> from the received first to eighth internal data ID<1:8>. The first to eighth data DATA<1:8> may be generated in series. The data input and output circuit 260 may output the first to eighth data DATA<1:8> to the controller 10.

At timing T38, the controller 10 may output the first chip selection signal CS1 for controlling the first memory device 20 to the first memory device 20.

At timing T39, the controller 10 may output, to the first memory device 20, the first to L-th command addresses CA<1:L> for controlling a data clock extension operation WEX before the read operation of the normal operation of the first memory device 20 is completed.

At timing T40, the command decoder 210 of the first memory device 20 may generate the synchronization signal WCE by decoding the first to L-th command addresses CA<1:L> when the first chip selection signal CS1 is enabled in synchronization with the clock CLK. The pulse generation circuit 312 of the control circuit 230 may generate the synchronization pulse SP based on the synchronization signal WCE.

At timing T41, the pulse generation circuit 312 of the control circuit 230 may generate the read pulse RP that is disabled at a logic low level after the time that is taken for all of the first to eighth data DATA<1:8> to be output from timing at which the read signal RD is enabled. The pull-down driving signal generation circuit 313 of the control circuit 230 may generate the pull-down driving signal PD having a logic low level because the synchronization pulse SP having a logic high level is generated although the read pulse RP is disabled from a logic high level to a logic low level as at timing T22 described with reference to FIG. 11.

At timing T42, the controller 10 may output the first chip selection signal CS1 for controlling the first memory device 20 to the first memory device 20.

At timing T43, the controller 10 may output, to the first memory device 20, the first to L-th command addresses CA<1:L> for controlling a read operation READ of the normal operation of the first memory device 20.

At timing T44, the command decoder 210 of the first memory device 20 may generate the read signal RD by decoding the first to L-th command addresses CA<1:L> when the first chip selection signal CS1 is enabled in synchronization with the clock CLK. The address decoder 220 of the first memory device 20 may generate the first to M-th internal addresses IADD<1:M> by decoding the first to L-th command addresses CA<1:L> that are input in synchronization with the clock CLK. The pulse generation circuit 312 of the control circuit 230 may generate the read pulse RP based on the read signal RD. The memory region 250 of the first memory device 20 may output the first to eighth internal data ID<1:8> that have been stored in any one of the first bank BK1, the second bank BK2, the third bank BK3, and the fourth bank BK4, which is selected by the first to M-th internal addresses IADD<1:M>, when the read signal RD is enabled.

At timing T45, the pulse generation circuit 312 of the control circuit 230 may generate the synchronization pulse SP that is disabled at a logic low level after a set interval.

At timing T46, the data input and output circuit 260 may receive the first to eighth internal data ID<1:8> in synchronization with the first internal clock ICLK, the second internal clock QCLK, the third internal clock ICLKB, and the fourth internal clock QCLKB, and may generate the first to eighth data DATA<1:8> from the received first to eighth internal data ID<1:8>. The first to eighth data DATA<1:8> may be generated in series. The data input and output circuit 260 may output the first to eighth data DATA<1:8> to the controller 10.

At timing T47, the pulse generation circuit 312 of the control circuit 230 may generate the read pulse RP that is disabled at a logic low level after the time that is taken for all of the first to eighth data DATA<1:8> to be output from timing at which the read signal RD is enabled. The pull-down driving signal generation circuit 313 of the control circuit 230 may generate the pull-down driving signal PD that is enabled at a logic high level when the read pulse RP is disabled from a logic high level to a logic low level.

The sync enable signal generation circuit 232 of the control circuit 230 may generate the sync enable signal WEN that is disabled at a logic low level at the timing at which the pull-down driving signal PD is enabled at a logic high level.

As described above, the semiconductor system 1 according to an embodiment of the present disclosure can maintain a clock synchronization operation when a data clock extension operation is performed before a normal operation is completed after a clock synchronization operation is performed. In an embodiment, the semiconductor system 1 can reduce current consumption because the data clock WCLK is not generated again by maintaining the clock synchronization operation when the data clock extension operation is performed before the normal operation is completed.

Figure 13:
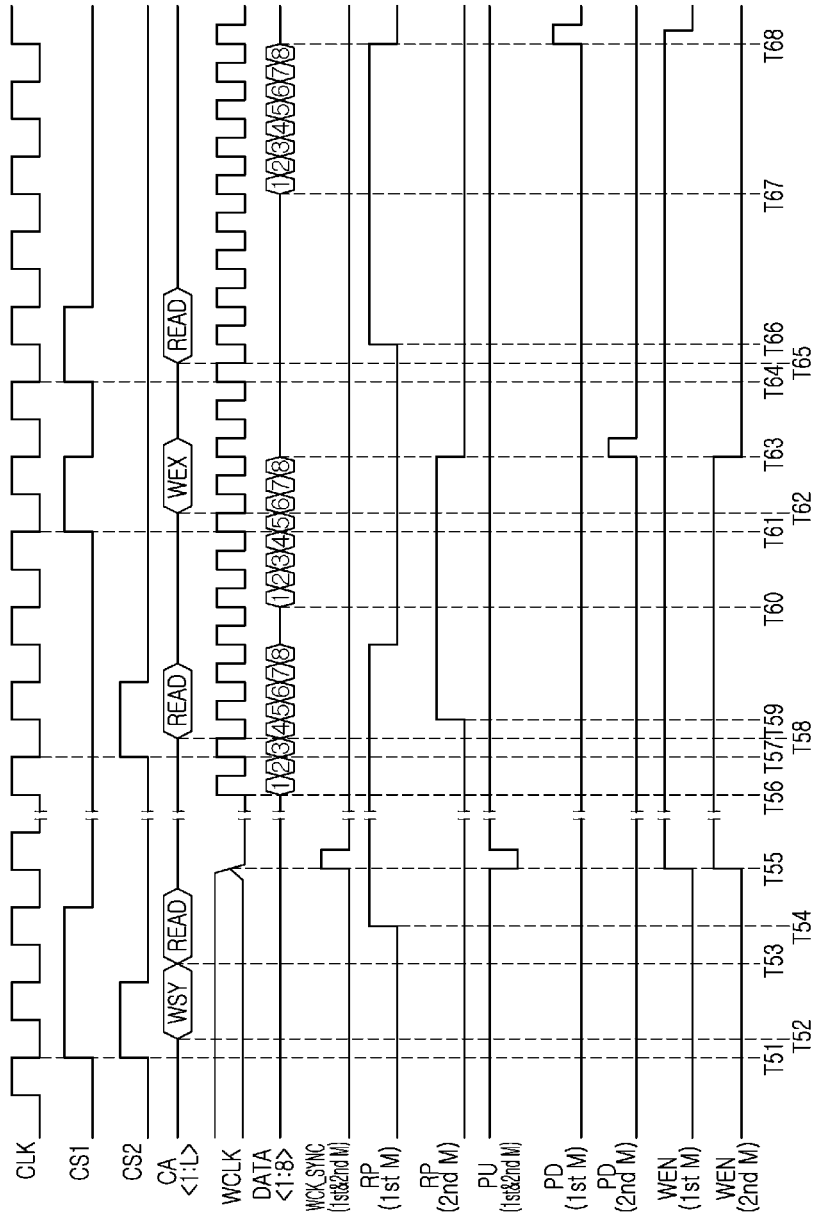

An operation of performing, by the semiconductor system 1 according to an embodiment of the present disclosure, a normal operation is described with reference to FIG. 13. In this case, an operation of performing, by the first memory device 20 and the second memory device 30, a data clock extension operation before read operations are completed is described as follows as an example.

At timing T51, the controller 10 may output the first chip selection signal CS1 for controlling the first memory device 20 to the first memory device 20, and may output the second chip selection signal CS2 for controlling the second memory device 30 to the second memory device 30.

At timing T52, the controller 10 may output the first to L-th command addresses CA<1:L> for controlling a clock synchronization operation WSY.

At timing T53, the controller 10 may output the first to L-th command addresses CA<1:L> for controlling a read operation READ of a normal operation of the first memory device 20.

At timing T54, the command decoder 210 of the first memory device 20 may generate the read signal RD by decoding the first to L-th command addresses CA<1:L> when the first chip selection signal CS1 is enabled in synchronization with the clock CLK. The address decoder 220 of the first memory device 20 may generate the first to M-th internal addresses IADD<1:M> by decoding the first to L-th command addresses CA<1:L> that are input in synchronization with the clock CLK. The pulse generation circuit 312 of the control circuit 230 may generate the read pulse RP (of the first memory device 20 (hereinafter abbreviated as the $1^{st}$ M)) based on the read signal RD. The memory region 250 of the first memory device 20 may output the first to eighth internal data ID<1:8> that have been stored in any one of the first bank BK1, the second bank BK2, the third bank BK3, and the fourth bank BK4, which is selected by the first to M-th internal addresses IADD<1:M>, when the read signal RD is enabled. An operation of generating the read pulse RP (of the $1^{st}$ M) from the read signal RD may be performed identically with the operation described with reference to FIGS. 11 and 12.

At timing T55, the controller 10 may output the data clock WCLK having a logic level fixed to a logic low level.

The command decoder 210 of the first memory device 20 may generate the data clock input control signal WCK_SYNC (of the $1^{st}$ M) by decoding the first to L-th command addresses CA<1:L> that have been input in order to control the clock synchronization operation WSY, when the first chip selection signal CS1 is enabled in synchronization with the clock CLK at timing T52. The driving signal generation circuit 231 of the control circuit 230 may generate the pull-up driving signal PU (of the $1^{st}$ M) that is enabled at a logic low level when the data clock input control signal WCK_SYNC (of the $1^{st}$ M) is enabled. The sync enable signal generation circuit 232 of the control circuit 230 may generate the sync enable signal WEN (of the $1^{st}$ M) that is enabled at a logic high level at the timing at which the pull-up driving signal PU (of the $1^{st}$ M) is enabled at a logic low level.

A command decoder (not illustrated) of the second memory device 30 may generate the data clock input control signal WCK_SYNC (of the second memory device 30 (hereinafter abbreviated as the 2nd M)) by decoding the first to L-th command addresses CA<1:L> that have been input in order to control the clock synchronization operation WSY when the first chip selection signal CS1 is enabled in synchronization with the clock CLK at timing T52. A driving signal generation circuit (not illustrated) of a control circuit (not illustrated) of the second memory device 30 may generate the pull-up driving signal PU (of the $2^{nd}$ M) that is enabled at a logic low level when the data clock input control signal WCK_SYNC (of the $2^{nd}$ M) is enabled. A sync enable signal generation circuit (not illustrated) of the control circuit (not illustrated) may generate the sync enable signal WEN (of the $2^{nd}$ M) that is enabled at a logic high level at the timing at which the pull-up driving signal PU (of the $2^{nd}$ M) is enabled at a logic low level.

At timing T56, the controller 10 may output the data clock WCLK that is periodically toggled. Timing T55 to timing T56 may be set as an interval in which the logic level of the data clock WCLK is fixed to a logic low level before the data clock WCLK is toggled.

The data clock input circuit 240 of the first memory device 20 may receive the data clock WCLK and the inverted data clock WCLKB when the sync enable signal WEN (of the $1^{st}$ M) is enabled to a logic high level. The data clock input circuit 240 of the first memory device 20 may generate the first internal clock ICLK, the second internal clock QCLK, the third internal clock ICLKB, and the fourth internal clock QCLKB by dividing the frequencies of the data clock WCLK and the inverted data clock WCLKB that have been received when the sync enable signal WEN (of the $1^{st}$ M) is enabled at a logic high level.

The data input and output circuit 260 of the first memory device 20 may receive the first to eighth internal data ID<1:8> in synchronization with the first internal clock ICLK, the second internal clock QCLK, the third internal clock ICLKB, and the fourth internal clock QCLKB, and may generate the first to eighth data DATA<1:8> from the received first to eighth internal data ID<1:8>. The first to eighth data DATA<1:8> may be generated in series. The data input and output circuit 260 may output the first to eighth data DATA<1:8> to the controller 10.

At timing T57, the controller 10 may output the second chip selection signal CS2 for controlling the second memory device 30 to the second memory device 30.

At timing T58, the controller 10 may output the first to L-th command addresses CA<1:L> for controlling a read operation READ of a normal operation of the second memory device 30.

At timing T59, the command decoder (not illustrated) of the second memory device 30 may generate the read signal RD by decoding the first to L-th command addresses CA<1:L> when the second chip selection signal CS2 is enabled in synchronization with the clock CLK. An address decoder (not illustrated) of the second memory device 30 may generate the first to M-th internal addresses IADD<1:M> by decoding the first to L-th command addresses CA<1:L> that are input in synchronization with the clock CLK. A pulse generation circuit (not illustrated) of the control circuit (not illustrated) may generate the read pulse RP (of the $2^{nd}$ M) based on the read signal RD. A memory region (not illustrated) of the second memory device 30 may output the first to eighth internal data ID<1:8> that have been stored in any one of the first bank BK1, the second bank BK2, the third bank BK3, and the fourth bank BK4, which is selected by the first to M-th internal addresses IADD<1:M>, when the read signal RD is enabled. An operation of generating the read pulse RP (of the $2^{nd}$ M) from the read signal RD may be performed identically with the operation described with reference to FIGS. 11 and 12.

At timing T60, a data clock input circuit (not illustrated) of the second memory device 30 may receive the data clock WCLK and the inverted data clock WCLKB when the sync enable signal WEN (of the $2^{nd}$ M) is enabled at a logic high level. The data clock input circuit (not illustrated) of the second memory device 30 may generate the first internal clock ICLK, the second internal clock QCLK, the third internal clock ICLKB, and the fourth internal clock QCLKB by dividing the frequencies of the data clock WCLK and the inverted data clock WCLKB that have been received when the sync enable signal WEN (of the 2nd M) is enabled at a logic high level.

A data input and output circuit (not illustrated) of the second memory device 30 may receive the first to eighth internal data ID<1:8> in synchronization with the first internal clock ICLK, the second internal clock QCLK, the third internal clock ICLKB, and the fourth internal clock QCLKB, and may generate the first to eighth data DATA<1:8> from the received first to eighth internal data ID<1:8>. The first to eighth data DATA<1:8> may be sequentially generated. The data input and output circuit (not illustrated) may output the first to eighth data DATA<1:8> to the controller 10.

At timing T61, the controller 10 may output the first chip selection signal CS1 for controlling the first memory device 20 to the first memory device 20.

At timing T62, the controller 10 may output, to the first memory device 20, the first to L-th command addresses CA<1:L> for controlling a data clock extension operation WEX before the read operation of the normal operation of the first memory device 20 is completed.

The command decoder 210 of the first memory device 20 may generate the synchronization signal WCE by decoding the first to L-th command addresses CA<1:L> when the first chip selection signal CS1 is enabled in synchronization with the clock CLK. The pulse generation circuit 312 of the control circuit 230 may generate the synchronization pulse SP based on the synchronization signal WCE. An operation of generating the synchronization pulse SP from the synchronization signal WCE may be performed identically with the operation described with reference to FIG. 12.

The pull-down driving signal generation circuit 313 of the control circuit 230 may generate the pull-down driving signal (PD of the $1^{st}$ M) having a logic low level because the synchronization pulse SP having a logic high level is generated although the read pulse RP (of the $1^{st}$ M) is disabled at a logic low level as at timing T22 described with reference to FIG. 11. An operation of generating the pull-down driving signal (PD of the $1^{st}$ M) from the synchronization pulse SP may be performed identically with the operation described with reference to FIG. 12.

At timing T63, the pulse generation circuit (not illustrated) of the control circuit (not illustrated) of the second memory device 30 may generate the read pulse RP (of the $2^{nd}$ M) that is disabled at a logic low level after the time that is taken for all of the first to eighth data DATA<1:8> to be output from timing at which the read signal RD is enabled. A pull-down driving signal generation circuit (not illustrated) of the control circuit (not illustrated) may generate the pull-down driving signal PD (of the $2^{nd}$ M) that is enabled at a logic high level when the read pulse RP (of the $2^{nd}$ M) is disabled from a logic high level to a logic low level.

A sync enable signal generation circuit (not illustrated) of the control circuit (not illustrated) may generate the sync enable signal WEN (of the $2^{nd}$ M) that is disabled at a logic low level at the timing at which the pull-down driving signal PD (of the $2^{nd}$ M) is enabled at a logic high level. The clock synchronization operation for the second memory device 30 is completed by the sync enable signal WEN (of the $2^{nd}$ M) that is disabled at a logic low level.

At timing T64, the controller 10 may output the first chip selection signal CS1 for controlling the first memory device 20 to the first memory device 20.

At timing T65, the controller 10 may output the first to L-th command addresses CA<1:L> for controlling a read operation READ of the normal operation of the first memory device 20.

At timing T66, the command decoder 210 of the first memory device 20 may generate the read signal RD by decoding the first to L-th command addresses CA<1:L> when the first chip selection signal CS1 is enabled in synchronization with the clock CLK. The address decoder 220 of the first memory device 20 may generate the first to M-th internal addresses IADD<1:M> by decoding the first to L-th command addresses CA<1:L> that are input in synchronization with the clock CLK. The pulse generation circuit 312 of the control circuit 230 may generate the read pulse RP (of the $1^{st}$ M) based on the read signal RD. The memory region 250 of the first memory device 20 may output the first to eighth internal data ID<1:8> that have been stored in any one of the first bank BK1, the second bank BK2, the third bank BK3, and the fourth bank BK4, which is selected by the first to M-th internal addresses IADD<1:M>, when the read signal RD is enabled. An operation of generating the read pulse RP (of the $1^{st}$ M) from the read signal RD may be performed identically with the operation described with reference to FIGS. 11 and 12.

At timing T67, the data clock input circuit 240 of the first memory device 20 may receive the data clock WCLK and the inverted data clock WCLKB when the sync enable signal WEN (of the $1^{st}$ M) is enabled at a logic high level. The data clock input circuit 240 of the first memory device 20 may generate the first internal clock ICLK, the second internal clock QCLK, the third internal clock ICLKB, and the fourth internal clock QCLKB by dividing the frequencies of the data clock WCLK and the inverted data clock WCLKB that have been received to have a logic high level when the sync enable signal WEN (of the $1^{st}$ M) is enabled.

The data input and output circuit 260 of the first memory device 20 may receive the first to eighth internal data ID<1:8> in synchronization with the first internal clock ICLK, the second internal clock QCLK, the third internal clock ICLKB, and the fourth internal clock QCLKB, and may generate the first to eighth data DATA<1:8> from the received first to eighth internal data ID<1:8>. The first to eighth data DATA<1:8> may be generated in series. The data input and output circuit 260 may output the first to eighth data DATA<1:8> to the controller 10.

At timing T68, the pulse generation circuit 312 of the control circuit 230 of the first memory device 20 may generate the read pulse RP (of the $1^{st}$ M) that is disabled at a logic low level after the time that is taken for all of the first to eighth data DATA<1:8> to be output from timing at which the read signal RD is enabled. The pull-down driving signal generation circuit 313 of the control circuit 230 may generate the pull-down driving signal (PD of the $1^{st}$ M) that is enabled at a logic high level when the read pulse RP (of the $1^{st}$ M) is disabled from a logic high level to a logic low level.

The sync enable signal generation circuit 232 of the control circuit 230 may generate the sync enable signal WEN (of the $1^{st}$ M) that is disabled at a logic low level at the timing at which the pull-down driving signal (PD of the $1^{st}$ M) is enabled at a logic high level. The clock synchronization operation for the first memory device 20 is completed by the sync enable signal WEN (of the $1^{st}$ M) that is disabled at a logic low level.

As described above, the semiconductor system 1 according to an embodiment of the present disclosure can maintain a clock synchronization operation when a data clock extension operation is performed before a normal operation of any one of multiple memory devices is completed. In an embodiment, the semiconductor system 1 can reduce current consumption because the data clock WCLK is not generated again by maintaining the clock synchronization operation when the data clock extension operation is performed before the normal operation of any one of the multiple memory devices is completed.

Figure 14:
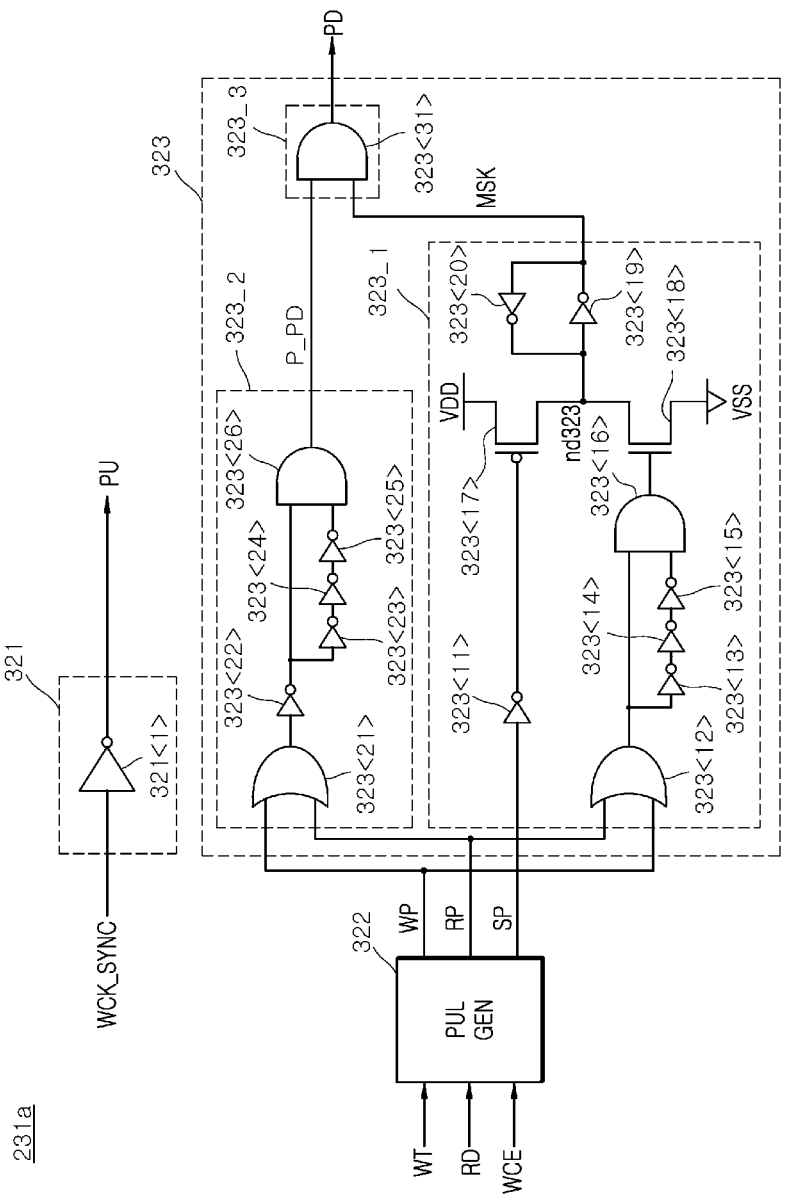
FIG. 14 is a diagram illustrating a configuration according to another embodiment of the driving signal generation circuit that is included in the control circuit illustrated in FIG. 3.

FIG. 14 is a diagram illustrating a configuration according to another embodiment of the driving signal generation circuit 231 that is included in the control circuit 230. A driving signal generation circuit 231a may include a pull-up driving signal generation circuit 321, a pulse generation circuit (PUL GEN) 322, and a pull-down driving signal generation circuit 323.

The pull-up driving signal generation circuit 321 may be implemented as an inverter 321<1>. The pull-up driving signal generation circuit 321 may generate the pull-up driving signal PU by inverting and buffering the data clock input control signal WCK_SYNC. The pull-up driving signal generation circuit 321 may generate the pull-up driving signal PU that is enabled at a logic low level when the data clock input control signal WCK_SYNC is enabled at a logic high level.

The pulse generation circuit 322 may generate the write pulse WP, the read pulse RP, and the synchronization pulse SP, based on the write signal WT, the read signal RD, and the synchronization signal WCE. The pulse generation circuit 322 may generate the write pulse WP that is disabled after the time that is taken for all of the data DATA<1:N> to be input from timing at which the write signal WT is enabled. The pulse generation circuit 322 may generate the read pulse RP that is disabled after the time that is taken for all of the data DATA<1:N> to be output from timing at which the read signal RD is enabled. The pulse generation circuit 322 may generate the synchronization pulse SP that is disabled after a set interval from timing at which the synchronization signal WCE is enabled. The set interval in which the synchronization pulse SP is disabled may be variously set in an embodiment.

The pull-down driving signal generation circuit 323 may include a masking signal generation circuit 323_1, a pre-pull-down driving signal generation circuit 323_2, and a logic circuit 323_3.

The masking signal generation circuit 323_1 may be implemented by using inverters 333<11>, 333<13>, 323<14>, 323<15>, 323<19>, and 323<20>, an OR gate 323<12>, an AND gate 323<16>, a PMOS transistor 323<17>, and an NMOS transistor 323<18>. The inverter 323<11> may invert and buffer the synchronization pulse SP. The OR gate 323<12>, the inverters 323<13>, 323<14>, and 323<15>, and the AND gate 323<16> may generate a signal that is enabled at a logic high level when the write pulse WP and the read signal RD are enabled from a logic low level to a logic high level. The PMOS transistor 323<17> may be connected between a source voltage VDD and a node nd323, and may drive the node nd323 at the level of the source voltage VDD when the output signal of the inverter 323<11> has a logic low level. The NMOS transistor 323<18> may be connected between the node nd323 and a ground voltage VSS, and may drive the node nd323 at the level of the ground voltage VSS when the output signal of the AND gate 323<16> has a logic high level. The inverters 323<19> and 323<20> may generate a masking signal MSK by latching the signal of the node nd323 and inverting and buffering the latched signal of the node nd323. The inverters 323<19> and 323<20> may generate the masking signal MSK that is disabled at a logic low level when the node nd323 is driven at the level of the source voltage VDD. The inverters 323<19> and 323<20> may generate the masking signal MSK that is enabled at a logic high level when the node nd323 is driven at the level of the ground voltage VSS. The masking signal generation circuit 323_1 may generate the masking signal MSK that is disabled at a logic low level when the synchronization pulse SP having a logic high level is input. The masking signal generation circuit 323_1 may generate the masking signal MSK that is enabled at a logic high level after any one of the write pulse WP and the read pulse RP, which has a logic high level, is input.

The pre-pull-down driving signal generation circuit 323_2 may be implemented by using an OR gate 323<21>, inverters 323<22>, 323<23>, 323<24>, and 323<25>, and an AND gate 323<26>. The pre-pull-down driving signal generation circuit 323_2 may generate a pre-pull-down driving signal P_PD that is enabled at a logic high level, when the write pulse WP having a logic low level is generated after the write pulse WP having a logic high level is input. The pre-pull-down driving signal generation circuit 323_2 may generate the pre-pull-down driving signal P_PD that is enabled at a logic high level, when the read pulse RP having a logic low level is generated after the read pulse RP having a logic high level is input.

The logic circuit 323_3 may be implemented as an AND gate 323<31>. The logic circuit 323_3 may block the pre-pull-down driving signal P_PD when the masking signal MSK is disabled at a logic low level. The logic circuit 323_3 may generate the pull-down driving signal PD having a logic low level when the masking signal MSK is disabled at a logic low level. The logic circuit 323_3 may generate the pull-down driving signal PD from the pre-pull-down driving signal P_PD when the masking signal MSK is enabled at a logic high level. The logic circuit 323_3 may generate the pull-down driving signal PD that is enabled at a logic high level, when the masking signal MSK is enabled at a logic high level and the pre-pull-down driving signal P_PD is enabled at a logic high level.

Figure 15:
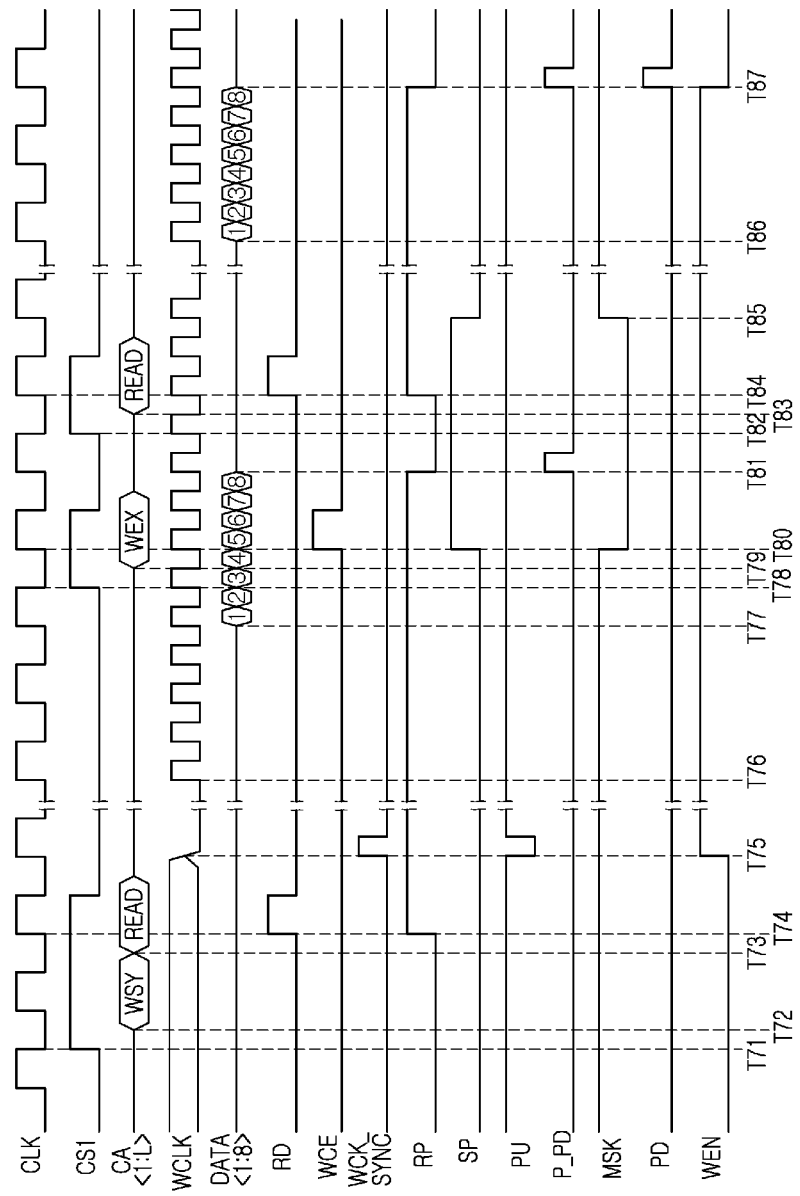
FIG. 15 is a timing diagram for describing an operation of the semiconductor system according to another embodiment of the present disclosure, which includes the driving signal generation circuit illustrated in FIG. 14.

An operation of performing, by the semiconductor system 1 including the driving signal generation circuit 231a disclosed in FIG. 14, a normal operation is described with reference to FIG. 15. In this case, an operation of performing, by the first memory device 20, a data clock extension operation before a read operation is completed after a clock synchronization operation is performed is described as follows as an example.

At timing T71, the controller 10 may output the first chip selection signal CS1 for controlling the first memory device 20 to the first memory device 20.

At timing T72, the controller 10 may output, to the first memory device 20, the first to L-th command addresses CA<1:L> for controlling a clock synchronization operation WSY of the first memory device 20.

At timing T73, the controller 10 may output, to the first memory device 20, the first to L-th command addresses CA<1:L> for controlling a read operation READ of a normal operation of the first memory device 20.

At timing T74, the command decoder 210 of the first memory device 20 may generate the read signal RD by decoding the first to L-th command addresses CA<1:L> when the first chip selection signal CS1 is enabled in synchronization with the clock CLK. The address decoder 220 of the first memory device 20 may generate the first to M-th internal addresses IADD<1:M> by decoding the first to L-th command addresses CA<1:L> that are input in synchronization with the clock CLK. The pulse generation circuit 322 of the control circuit 230 may generate the read pulse RP based on the read signal RD. The memory region 250 of the first memory device 20 may output the first to eighth internal data ID<1:8> that have been stored in any one of the first bank BK1, the second bank BK2, the third bank BK3, and the fourth bank BK4, which is selected by the first to M-th internal addresses IADD<1:M>, when the read signal RD is enabled.

At timing T75, the controller 10 may output, to the first memory device 20, the data clock WCLK having a logic level fixed to a logic low level.

The command decoder 210 of the first memory device 20 may generate the data clock input control signal WCK_SYNC by decoding the first to L-th command addresses CA<1:L> that have been input in order to control the clock synchronization operation WSY, when the first chip selection signal CS1 is enabled in synchronization with the clock CLK at timing T72. The driving signal generation circuit 231 of the control circuit 230 may generate the pull-up driving signal PU that is enabled at a logic low level when the data clock input control signal WCK_SYNC is enabled. The sync enable signal generation circuit 232 of the control circuit 230 may generate the sync enable signal WEN that is enabled at a logic high level at the timing at which the pull-up driving signal PU is enabled at a logic low level.

At timing T76, the controller 10 may output, to the first memory device 20, the data clock WCLK that is periodically toggled. Timing T75 to timing T76 may be set as an interval in which the logic level of the data clock WCLK is fixed to a logic low level before the data clock WCLK is toggled.

The data clock input circuit 240 of the first memory device 20 may receive the data clock WCLK and the inverted data clock WCLKB when the sync enable signal WEN is enabled at a logic high level. The data clock input circuit 240 of the first memory device 20 may generate the first internal clock ICLK, the second internal clock QCLK, the third internal clock ICLKB, and the fourth internal clock QCLKB by dividing the frequencies of the data clock WCLK and the inverted data clock WCLKB that have been received when the sync enable signal WEN is enabled at a logic high level.

At timing T77, the data input and output circuit 260 may receive the first to eighth internal data ID<1:8> in synchronization with the first internal clock ICLK, the second internal clock QCLK, the third internal clock ICLKB, and the fourth internal clock QCLKB, and may generate the first to eighth data DATA<1:8> from the received first to eighth internal data ID<1:8>. The first to eighth data DATA<1:8> may be generated in series. The data input and output circuit 260 may output the first to eighth data DATA<1:8> to the controller 10. At timing T78, the controller 10 may output the first chip selection signal CS1 for controlling the first memory device 20 to the first memory device 20.

At timing T79, the controller 10 may output, to the first memory device 20, the first to L-th command addresses CA<1:L> for controlling a data clock extension operation WEX before the read operation of the normal operation of the first memory device 20 is completed.

At timing T80, the command decoder 210 of the first memory device 20 may generate the synchronization signal WCE by decoding the first to L-th command addresses CA<1:L> when the first chip selection signal CS1 is enabled in synchronization with the clock CLK. The pulse generation circuit 322 of the control circuit 230 may generate the synchronization pulse SP based on the synchronization signal WCE. The masking signal generation circuit 323_1 of the control circuit 230 may generate the masking signal MSK that is disabled at a logic low level when the synchronization pulse SP having a logic high level is input.

At timing T81, the pulse generation circuit 322 of the control circuit 230 may generate the read pulse RP that is disabled at a logic low level after the time that is taken for all of the first to eighth data DATA<1:8> to be output from timing at which the read signal RD is enabled. The pre-pull-down driving signal generation circuit 323_2 of the control circuit 230 may generate the pre-pull-down driving signal P_PD that is enabled at a logic high level, when the read pulse RP having a logic low level is generated after the read pulse RP having a logic high level is input. The logic circuit 323_3 of the control circuit 230 may generate the pull-down driving signal PD having a logic low level by blocking the pre-pull-down driving signal P_PD when the masking signal MSK is disabled at a logic low level.

At timing T82, the controller 10 may output the first chip selection signal CS1 for controlling the first memory device 20 to the first memory device 20.

At timing T83, the controller 10 may output, to the first memory device 20, the first to L-th command addresses CA<1:L> for controlling a read operation READ of the normal operation of the first memory device 20.

At timing T84, the command decoder 210 of the first memory device 20 may generate the read signal RD by decoding the first to L-th command addresses CA<1:L> when the first chip selection signal CS1 is enabled in synchronization with the clock CLK. The address decoder 220 of the first memory device 20 may generate the first to M-th internal addresses IADD<1:M> by decoding the first to L-th command addresses CA<1:L> that are input in synchronization with the clock CLK. The pulse generation circuit 322 of the control circuit 230 may generate the read pulse RP based on the read signal RD. The memory region 250 of the first memory device 20 may output the first to eighth internal data ID<1:8> that have been stored in any one of the first bank BK1, the second bank BK2, the third bank BK3, and the fourth bank BK4, which is selected by the first to M-th internal addresses IADD<1:M>, when the read signal RD is enabled.

At timing T85, the pulse generation circuit 322 of the control circuit 230 may generate the synchronization pulse SP that is disabled at a logic low level after a set interval. The masking signal generation circuit 323_1 of the control circuit 230 may generate the masking signal MSK that is enabled at a logic high level when the synchronization pulse SP having a logic low level is input.

At timing T86, the data input and output circuit 260 may receive the first to eighth internal data ID<1:8> in synchronization with the first internal clock ICLK, the second internal clock QCLK, the third internal clock ICLKB, and the fourth internal clock QCLKB, and may generate the first to eighth data DATA<1:8> from the received first to eighth internal data ID<1:8>. The first to eighth data DATA<1:8> may be generated in series. The data input and output circuit 260 may output the first to eighth data DATA<1:8> to the controller 10.

At timing T87, the pulse generation circuit 322 of the control circuit 230 may generate the read pulse RP that is disabled at a logic low level after the time that is taken for all of the first to eighth data DATA<1:8> to be output from timing at which the read signal RD is enabled. The pull-down driving signal generation circuit 323 of the control circuit 230 may generate the pull-down driving signal PD that is enabled at a logic high level when the read pulse RP is disabled from a logic high level to a logic low level.

The sync enable signal generation circuit 232 of the control circuit 230 may generate the sync enable signal WEN that is disabled at a logic low level at the timing at which the pull-down driving signal PD is enabled at a logic high level.

As described above, the semiconductor system 1 according to an embodiment of the present disclosure can maintain a clock synchronization operation when a data clock extension operation is performed before a normal operation is completed after the clock synchronization operation is performed. In an embodiment, the semiconductor system 1 can reduce current consumption because the data clock WCLK is not generated again by maintaining the clock synchronization operation when the data clock extension operation is performed before the normal operation is completed.

Figure 16:
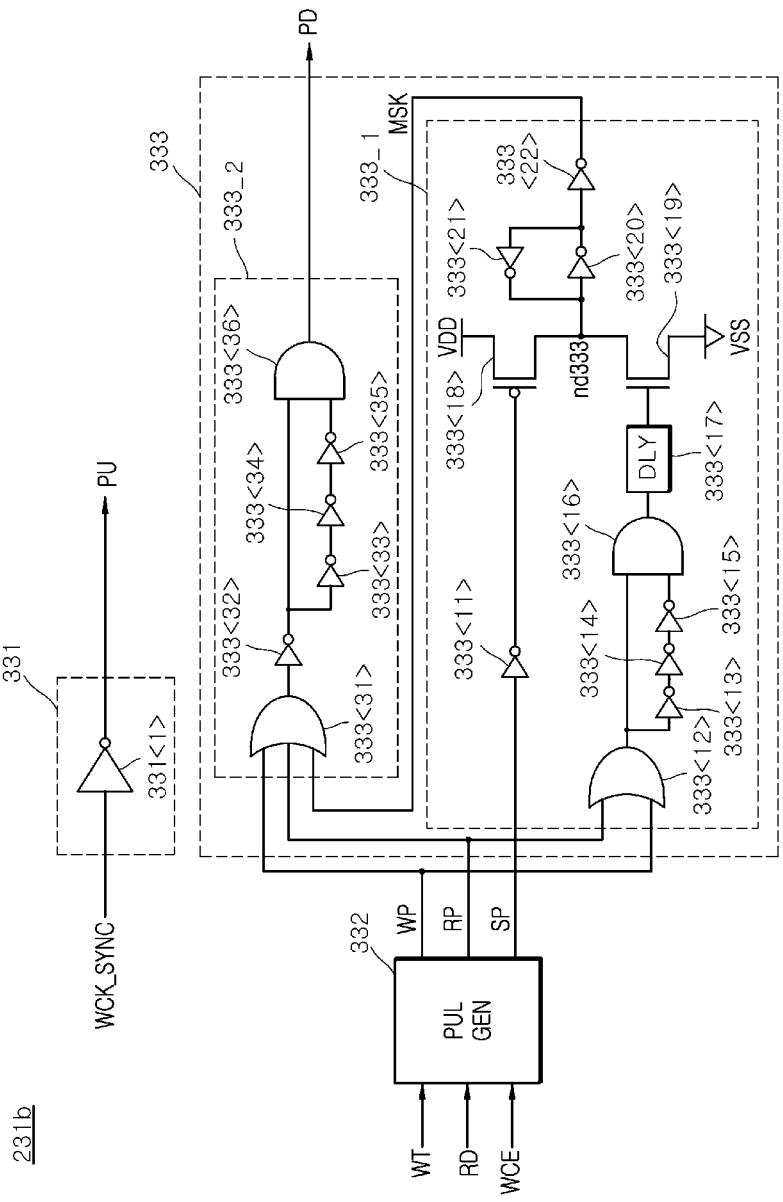
FIG. 16 is a diagram illustrating a configuration according to another embodiment of the driving signal generation circuit that is included in the control circuit illustrated in FIG. 3.

FIG. 16 is a diagram illustrating a configuration according to another embodiment of the driving signal generation circuit 231 that is included in the control circuit 230. A driving signal generation circuit 231*b* may include a pull-up driving signal generation circuit 331, a pulse generation circuit (PUL GEN) 332, and a pull-down driving signal generation circuit 333.

The pull-up driving signal generation circuit 331 may be implemented as an inverter 331<1>. The pull-up driving signal generation circuit 331 may generate the pull-up driving signal PU by inverting and buffering the data clock input control signal WCK_SYNC. The pull-up driving signal generation circuit 331 may generate the pull-up driving signal PU that is enabled at a logic low level when the data clock input control signal WCK_SYNC is enabled at a logic high level.

The pulse generation circuit 332 may generate the write pulse WP, the read pulse RP, and the synchronization pulse SP, based on the write signal WT, the read signal RD, and the synchronization signal WCE. The pulse generation circuit 332 may generate the write pulse WP that is disabled after the time that is taken for all of the data DATA<1:N> to be input from timing at which the write signal WT is enabled. The pulse generation circuit 332 may generate the read pulse RP that is disabled after the time that is taken for all of the data DATA<1:N> to be output from timing at which the read signal RD is enabled. The pulse generation circuit 332 may generate the synchronization pulse SP that is disabled after a set interval from timing at which the synchronization signal WCE is enabled. The set interval in which the synchronization pulse SP is disabled may be variously set in an embodiment.

The pull-down driving signal generation circuit 333 may include a masking signal generation circuit 333_1 and a logic circuit 333_2.

The masking signal generation circuit 333_1 may be implemented by using inverters 333<11>, 333<13>, 333<14>, 333<15>, 333<20>, 333<21>, and 333<22>, an OR gate 333<12>, an AND gate 333<16>, a delay circuit (DLY) 333<17>, a PMOS transistor 333<18>, and an NMOS transistor 333<19>. The inverter 333<11> may invert and buffer the synchronization pulse SP. The OR gate 333<12>, the inverters 333<13>, 333<14>, and 333<15>, the AND gate 333<16>, and the delay circuit 333<17> may generate a signal that is enabled at a logic high level after a delay time of the delay circuit 333<12> from timing at which the write pulse WP and the read signal RD are enabled from a logic low level to a logic high level. The PMOS transistor 333<18> may be connected between a source voltage VDD and a node nd333, and may drive the node nd333 at the level of the source voltage VDD when the output signal of the inverter 333<11> has a logic low level. The NMOS transistor 333<19> may be connected between the node nd333 and a ground voltage VSS, and may drive the node nd333 at the level of the ground voltage VSS when the output signal of the delay circuit 333<12> has a logic high level. The inverters 333<20>, 333<21>, and 333<22> may latch the signal of the node nd333, and may generate a masking signal MSK by buffering the latched signal of the node nd333. The inverters 333<20>, 333<21>, and 333<22> may generate the masking signal MSK that is enabled at a logic high level when the node nd333 is driven at the level of the source voltage VDD. The inverters 333<20>, 333<21>, and 333<22> may generate the masking signal MSK that is disabled at a logic low level when the node nd333 is driven at the level of the ground voltage VSS. The masking signal generation circuit 333_1 may generate the masking signal MSK that is enabled at a logic high level when the synchronization pulse SP having a logic high level is input. The masking signal generation circuit 333_1 may generate the masking signal MSK that is disabled at a logic low level after any one of the write pulse WP and the read pulse RP, which has a logic high level, is input.

The logic circuit 333_2 may be implemented by using an OR gate 333<31>, inverters 333<32>, 333<33>, 333<34>, and 333<35>, and an AND gate 333<36>. The logic circuit 333_2 may generate the pull-down driving signal PD that is enabled at a logic high level when the write pulse WP having a logic low level is generated after the write pulse WP having a logic high level is input. The logic circuit 333_2 may generate the pull-down driving signal PD that is enabled at a logic high level when the read pulse RP having a logic low level is generated after the read pulse RP having a logic high level is input. The logic circuit 333_2 may generate the pull-down driving signal PD that is enabled at a logic high level when the masking signal MSK having a logic low level is generated after the masking signal MSK having a logic high level is input.

Figure 17:
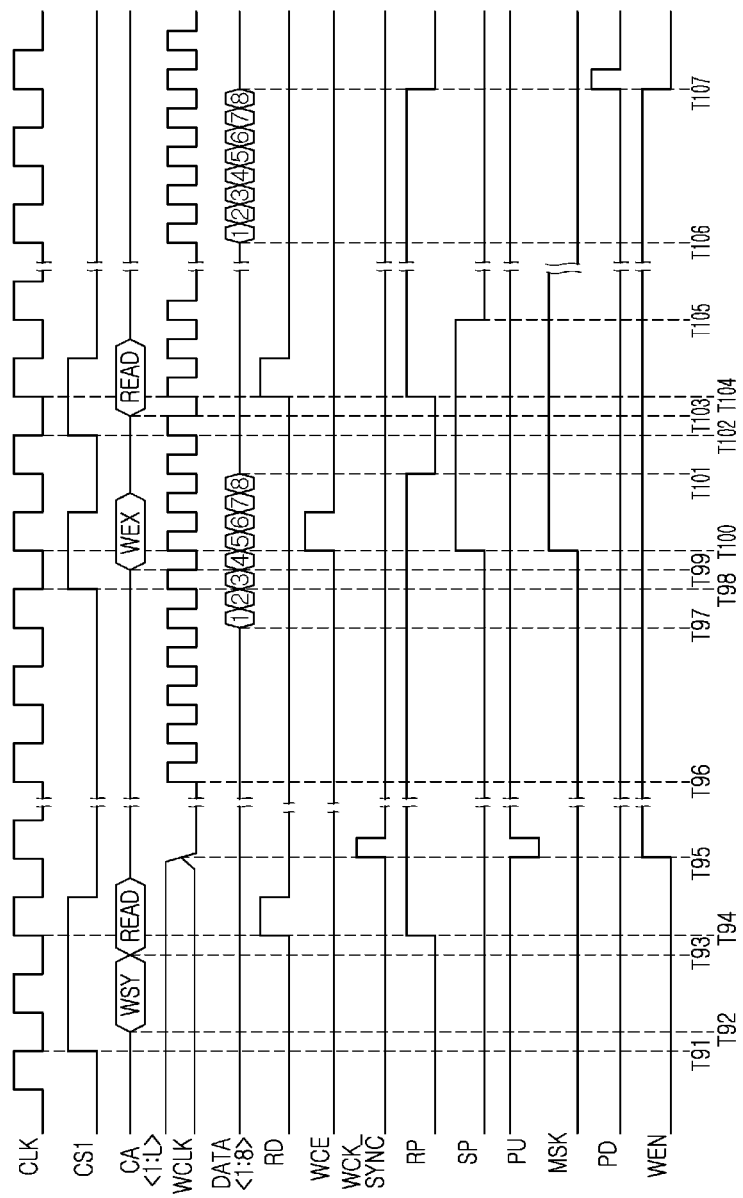
FIG. 17 is a timing diagram for describing an operation of the semiconductor system according to another embodiment of the present disclosure, which includes the driving signal generation circuit illustrated in FIG. 16.

An operation of performing, by the semiconductor system 1 including the driving signal generation circuit 231*b* disclosed in FIG. 15, a normal operation is described with reference to FIG. 17. In this case, an operation of performing, by the first memory device 20, a data clock extension operation before a read operation is completed after a clock synchronization operation is performed is described as follows as an example.

At timing T91, the controller 10 may output the first chip selection signal CS1 for controlling the first memory device 20 to the first memory device 20.

At timing T92, the controller 10 may output, to the first memory device 20, the first to L-th command addresses CA<1:L> for controlling a clock synchronization operation WSY of the first memory device 20.

At timing T93, the controller 10 may output, to the first memory device 20, the first to L-th command addresses CA<1:L> for controlling a read operation READ of a normal operation of the first memory device 20.

At timing T94, the command decoder 210 of the first memory device 20 may generate the read signal RD by decoding the first to L-th command addresses CA<1:L> when the first chip selection signal CS1 is enabled in synchronization with the clock CLK. The address decoder 220 of the first memory device 20 may generate the first to M-th internal addresses IADD<1:M> by decoding the first to L-th command addresses CA<1:L> that are input in synchronization with the clock CLK. The pulse generation circuit 332 of the control circuit 230 may generate the read pulse RP based on the read signal RD. The memory region 250 of the first memory device 20 may output the first to eighth internal data ID<1:8> that have been stored in any one of the first bank BK1, the second bank BK2, the third bank BK3, and the fourth bank BK4, which is selected by the first to M-th internal addresses IADD<1:M>, when the read signal RD is enabled.

At timing T95, the controller 10 may output, to the first memory device 20, the data clock WCLK having a logic level fixed to a logic low level.

The command decoder 210 of the first memory device 20 may generate the data clock input control signal WCK_SYNC by decoding the first to L-th command addresses CA<1:L> that have been input in order to control the clock synchronization operation WSY, when the first chip selection signal CS1 is enabled in synchronization with the clock CLK at timing T92. The driving signal generation circuit 231 of the control circuit 230 may generate the pull-up driving signal PU that is enabled at a logic low level when the data clock input control signal WCK_SYNC is enabled. The sync enable signal generation circuit 232 of the control circuit 230 may generate the sync enable signal WEN that is enabled at a logic high level at the timing at which the pull-up driving signal PU is enabled at a logic low level.

At timing T96, the controller 10 may output, to the first memory device 20, the data clock WCLK that is periodically toggled. Timing T95 to timing T96 may be set as an interval in which the logic level of the data clock WCLK is fixed to a logic low level before the data clock WCLK is toggled.

The data clock input circuit 240 of the first memory device 20 may receive the data clock WCLK and the inverted data clock WCLKB when the sync enable signal WEN is enabled at a logic high level. The data clock input circuit 240 of the first memory device 20 may generate the first internal clock ICLK, the second internal clock QCLK, the third internal clock ICLKB, and the fourth internal clock QCLKB by dividing the frequencies of the data clock WCLK and the inverted data clock WCLKB having a logic level that has been received as a logic high level when the sync enable signal WEN is enabled.

At timing T97, the data input and output circuit 260 may receive the first to eighth internal data ID<1:8> in synchronization with the first internal clock ICLK, the second internal clock QCLK, the third internal clock ICLKB, and the fourth internal clock QCLKB, and may generate the first to eighth data DATA<1:8> from the received first to eighth internal data ID<1:8>. The first to eighth data DATA<1:8> may be generated in series. The data input and output circuit 260 may output the first to eighth data DATA<1:8> to the controller 10.

At timing T98, the controller 10 may output the first chip selection signal CS1 for controlling the first memory device 20 to the first memory device 20.

At timing T99, the controller 10 may output, to the first memory device 20, the first to L-th command addresses CA<1:L> for controlling a data clock extension operation WEX before the read operation READ of the normal operation of the first memory device 20 is completed.

At timing T100, the command decoder 210 of the first memory device 20 may generate the synchronization signal WCE by decoding the first to L-th command addresses CA<1:L> when the first chip selection signal CS1 is enabled in synchronization with the clock CLK. The pulse generation circuit 332 of the control circuit 230 may generate the synchronization pulse SP based on the synchronization signal WCE. The masking signal generation circuit 333_1 of the control circuit 230 may generate the masking signal MSK that is enabled at a logic high level when the synchronization pulse SP having a logic high level is input.

At timing T101, the pulse generation circuit 332 of the control circuit 230 may generate the read pulse RP that is disabled at a logic low level after the time that is taken for all of the first to eighth data DATA<1:8> to be output from timing at which the read signal RD is enabled. The logic circuit 333_2 of the control circuit 230 may generate the pull-down driving signal PD that is disabled at a logic low level when the masking signal MSK having a logic high level is input.

At timing T102, the controller 10 may output the first chip selection signal CS1 for controlling the first memory device 20 to the first memory device 20.

At timing T103, the controller 10 may output, to the first memory device 20, the first to L-th command addresses CA<1:L> for controlling a read operation READ of the normal operation of the first memory device 20.

At timing T104, the command decoder 210 of the first memory device 20 may generate the read signal RD by decoding the first to L-th command addresses CA<1:L> when the first chip selection signal CS1 is enabled in synchronization with the clock CLK. The address decoder 220 of the first memory device 20 may generate the first to M-th internal addresses IADD<1:M> by decoding the first to L-th command addresses CA<1:L> that are input in synchronization with the clock CLK. The pulse generation circuit 332 of the control circuit 230 may generate the read pulse RP based on the read signal RD. The memory region 250 of the first memory device 20 may output the first to eighth internal data ID<1:8> that have been stored in any one of the first bank BK1, the second bank BK2, the third bank BK3, and the fourth bank BK4, which is selected by the first to M-th internal addresses IADD<1:M>, when the read signal RD is enabled.

At timing T105, the pulse generation circuit 332 of the control circuit 230 may generate the synchronization pulse SP that is disabled at a logic low level after a set interval.

At timing T106, the data input and output circuit 260 may receive the first to eighth internal data ID<1:8> in synchronization with the first internal clock ICLK, the second internal clock QCLK, the third internal clock ICLKB, and the fourth internal clock QCLKB, and may generate the first to eighth data DATA<1:8> from the received first to eighth internal data ID<1:8>. The first to eighth data DATA<1:8> may be generated in series. The data input and output circuit 260 may output the first to eighth data DATA<1:8> to the controller 10.

At timing T107, the pulse generation circuit 332 of the control circuit 230 may generate the read pulse RP that is disabled at a logic low level after the time that is taken for all of the first to eighth data DATA<1:8> to be output from timing at which the read signal RD is enabled. The pull-down driving signal generation circuit 333 of the control circuit 230 may generate the pull-down driving signal PD that is enabled at a logic high level when the read pulse RP is disabled from a logic high level to a logic low level.

The sync enable signal generation circuit 232 of the control circuit 230 may generate the sync enable signal WEN that is disabled at a logic low level at the timing at which the pull-down driving signal PD is enabled at a logic high level.

As described above, the semiconductor system 1 according to an embodiment of the present disclosure can maintain a clock synchronization operation when a data clock extension operation is performed before a normal operation is completed after the clock synchronization operation is performed. In an embodiment, the semiconductor system 1 can reduce current consumption because the data clock WCLK is not generated again by maintaining the clock synchronization operation when the data clock extension operation is performed before the normal operation is completed.

Figure 18:
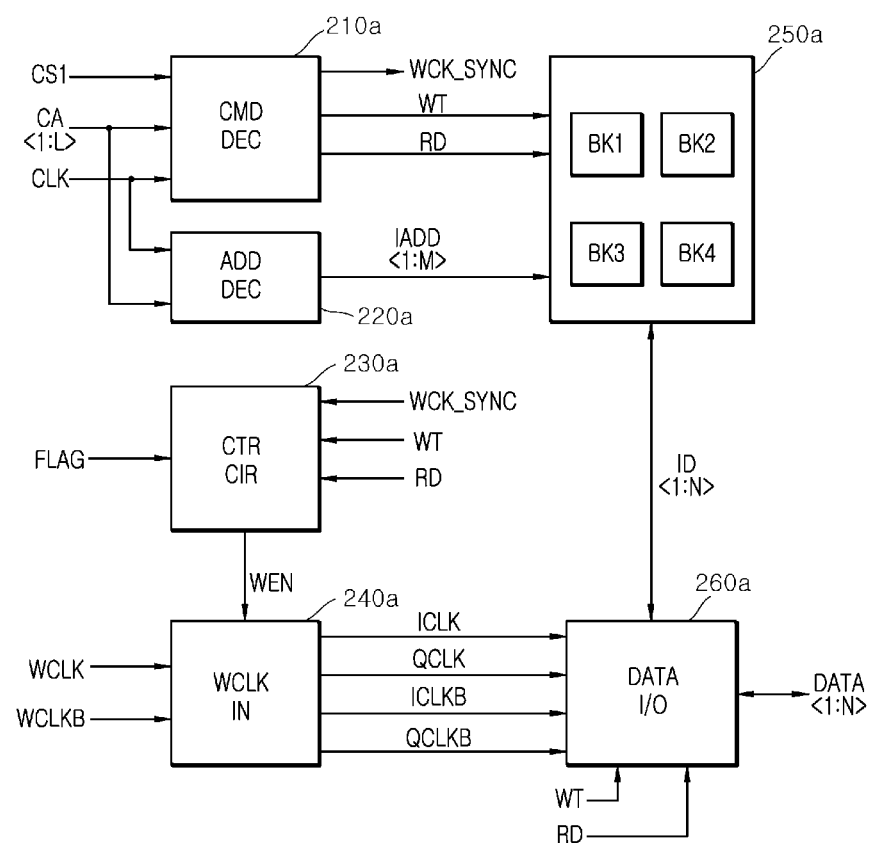
FIG. 18 is a block diagram illustrating a configuration according to another embodiment of the first memory device that is included in the semiconductor system illustrated in FIG. 1.

FIG. 18 is a block diagram illustrating a configuration according to another embodiment of the first memory device 20 that is included in the semiconductor system 1. The first memory device 20a may include a command decoder (CMD DEC) 210a, an address decoder (ADD DEC) 220a, a control circuit (CTR CIR) 230a, a data clock input circuit (WCLK IN) 240a, a memory region 250a, and a data input and output circuit (DATA I/O) 260a.

The command decoder 210a may generate a data clock input control signal WCK_SYNC, a write signal WT and a read signal RD by decoding first to L-th command addresses CA<1:L> when the first chip selection signal CS1 is enabled. The command decoder 210a may generate the data clock input control signal WCK_SYNC that is enabled if the first to L-th command addresses CA<1:L> that are input in synchronization with the clock CLK when the first chip selection signal CS1 is enabled have a logic level combination for performing a clock synchronization operation. The command decoder 210a may generate the write signal WT that is enabled if the first to L-th command addresses CA<1:L> that are input in synchronization with the clock CLK when the first chip selection signal CS1 is enabled have a logic level combination for performing a write operation of a normal operation. The command decoder 210a may generate the read signal RD that is enabled if the first to L-th command addresses CA<1:L> that are input in synchronization with the clock CLK when the first chip selection signal CS1 is enabled have a logic level combination for performing a read operation of the normal operation. The number "L" of bits of the first to L-th command addresses CA<1:L> may be set as various numbers in an embodiment. The number "L" of bits of the first to L-th command addresses CA<1:L> may be set as a natural number. The command decoder 210a may be implemented as the same circuit as the command decoder 210 illustrated in FIG. 2 and may perform the same operation as the command decoder 210, except an operation of generating the synchronization signal WCE.

The address decoder 220a may generate first to M-th internal addresses IADD<1:M> by decoding the first to L-th command addresses CA<1:L> that are input in synchronization with the clock CLK. The number "M" of bits of the first to M-th internal addresses IADD<1:M> may be set as various numbers in an embodiment. The number "M" of bits of the first to M-th internal addresses IADD<1:M> may be set as a natural number. The address decoder 220a may be implemented as the same circuit as the address decoder 220 illustrated in FIG. 2 and may perform the same operation as the address decoder 220.

The control circuit 230a may generate a sync enable signal WEN based on the data clock input control signal WCK_SYNC, the write signal WT, the read signal RD, and a flag signal FLAG. The control circuit 230a may generate the sync enable signal WEN that is enabled at timing at which the data clock input control signal WCK_SYNC is enabled in a normal operation. The control circuit 230a may generate the sync enable signal WEN that is disabled after a set interval from timing at which the write signal WT and the read signal RD are enabled in the normal operation. The control circuit 230a may generate the sync enable signal WEN the disable timing of which is delayed when the flag signal FLAG is input before the last write signal WT and the last read signal RD are input while the write signal WT and the read signal RD are continuously input in the normal operation. The flag signal FLAG may be set as a signal that is input through any one bit that is included in the first to L-th command addresses CA<1:L>.

The data clock input circuit 240a may receive the data clock WCLK and an inverted data clock WCLKB when the sync enable signal WEN is enabled. The data clock input circuit 240a may generate a first internal clock ICLK, a second internal clock QCLK, a third internal clock ICLKB, and a fourth internal clock QCLKB by dividing the frequencies of the data clock WCLK and the inverted data clock WCLKB that have been received when the sync enable signal WEN is enabled. The data clock input circuit 240a may generate the first internal clock ICLK, the second internal clock QCLK, the third internal clock ICLKB, and the fourth internal clock QCLKB having different phases by dividing the frequencies of the data clock WCLK and the inverted data clock WCLKB that have been received when the sync enable signal WEN is enabled. The data clock input circuit 240a may be implemented as the same circuit as the data clock input circuit 240 illustrated in FIG. 2 and may be implemented to perform the same operation as the data clock input circuit 240, and a detailed description of the data clock input circuit 240a is omitted.

The memory region 250a may include a first bank BK1, a second bank BK2, a third bank BK3, and a fourth bank BK4. The memory region 250a may store first to N-th internal data ID<1:N> after the start of a write operation of a normal operation. The memory region 250a may store the first to N-th internal data ID<1:N> in any one of the first bank BK1, the second bank BK2, the third bank BK3, and the fourth bank BK4, which is selected by the first to M-th internal addresses IADD<1:M>, when the write signal WT is enabled. The memory region 250a may output the first to N-th internal data ID<1:N> that have been stored after the start of a read operation of the normal operation. The memory region 250a may output the first to N-th internal data ID<1:N> that have been stored in any one of the first bank BK1, the second bank BK2, the third bank BK3, and the fourth bank BK4, which is selected by the first to M-th internal addresses IADD<1:M>, when the read signal RD is enabled. The memory region 250a has been implemented to include the four banks, but may be implemented to include various numbers of banks in an embodiment. Each of the first bank BK1, the second bank BK2, the third bank BK3, and the fourth bank BK4 may be implemented as a common bank that includes multiple memory cells (not illustrated) and that stores and outputs data.

The data input and output circuit 260a may generate the first to N-th internal data ID<1:N> by receiving first to N-th data DATA<1:N> that are input from the controller 10 after the start of a write operation of a normal operation. The data input and output circuit 260a may receive the first to N-th data DATA<1:N> in synchronization with the first internal clock ICLK, the second internal clock QCLK, the third internal clock ICLKB, and the fourth internal clock QCLKB when the write signal WT is enabled, and may generate the first to N-th internal data ID<1:N> from the received first to N-th data DATA<1:N>. The data input and output circuit 260a may output the first to N-th internal data ID<1:N> to the memory region 250a when the write signal WT is enabled. The data input and output circuit 260a may generate the first to N-th data DATA<1:N> by receiving the first to N-th internal data ID<1:N> that are input from the memory region 250a, after the start of a read operation of the normal operation. The data input and output circuit 260a may receive the first to N-th internal data ID<1:N> in synchronization with the first internal clock ICLK, the second internal clock QCLK, the third internal clock ICLKB, and the fourth internal clock QCLKB when the read signal RD is enabled, and may generate the first to N-th data DATA<1:N> from the received first to N-th internal data ID<1:N>. The data input and output circuit 260a may output the first to N-th data DATA<1:N> to the controller 10 when the read signal RD is enabled. The number "N" of bits of the first to N-th internal data ID<1:N> may be set as various numbers in an embodiment. The number "N" of bits of the first to N-th internal data ID<1:N> may be set as a natural number. The number "N" of bits of the first to N-th data DATA<1:N> may be set as various numbers in an embodiment. The number "N" of bits of the first to N-th data DATA<1:N> may be set as a natural number. The data input and output circuit 260a may be implemented as the same circuit as the data input and output circuit 260 illustrated in FIG. 2 and may be implemented to perform the same operation as the data input and output circuit 260, and a detailed description of the data input and output circuit 260a is omitted.

Figure 19:
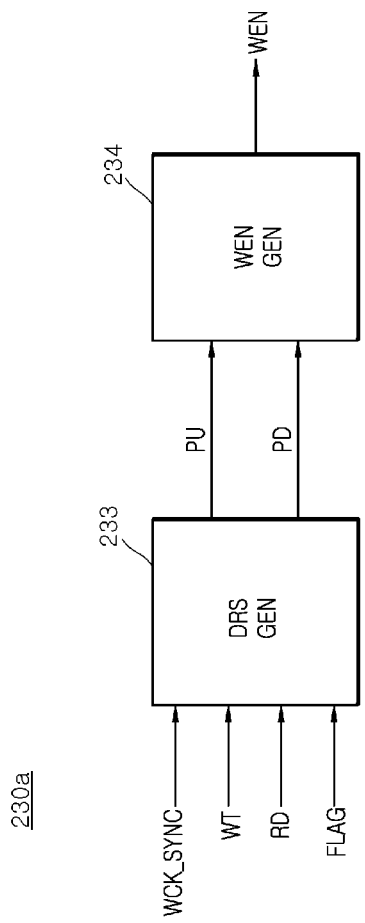
FIG. 19 is a block diagram illustrating a configuration according to an embodiment of the control circuit that is included in the first memory device illustrated in FIG. 18.

FIG. 19 is a block diagram illustrating a configuration according to an embodiment of the control circuit 230a that is included in the first memory device 20a. The control circuit 230a may include a driving signal generation circuit (DRS GEN) 233 and a sync enable signal generation circuit (WEN GEN) 234.

The driving signal generation circuit 233 may generate a pull-up driving signal PU and a pull-down driving signal PD, based on the data clock input control signal WCK_SYNC, the write signal WT, the read signal RD, and the flag signal FLAG. The driving signal generation circuit 233 may generate the pull-up driving signal PU that is enabled when the data clock input control signal WCK_SYNC is enabled. The driving signal generation circuit 233 may generate the pull-down driving signal PD that is enabled after any one of the write signal WT and the read signal RD is enabled. The driving signal generation circuit 233 may generate the pull-down driving signal PD the enable timing of which is delayed when the flag signal FLAG is enabled before any one of the write signal WT and the read signal RD is enabled.

The sync enable signal generation circuit 234 may generate the sync enable signal WEN based on the pull-up driving signal PU and the pull-down driving signal PD. The sync enable signal generation circuit 234 may generate the sync enable signal WEN that is enabled at timing at which the pull-up driving signal PU is enabled. The sync enable signal generation circuit 234 may generate the sync enable signal WEN that is disabled at timing at which the pull-down driving signal PD is enabled.

Figure 20:
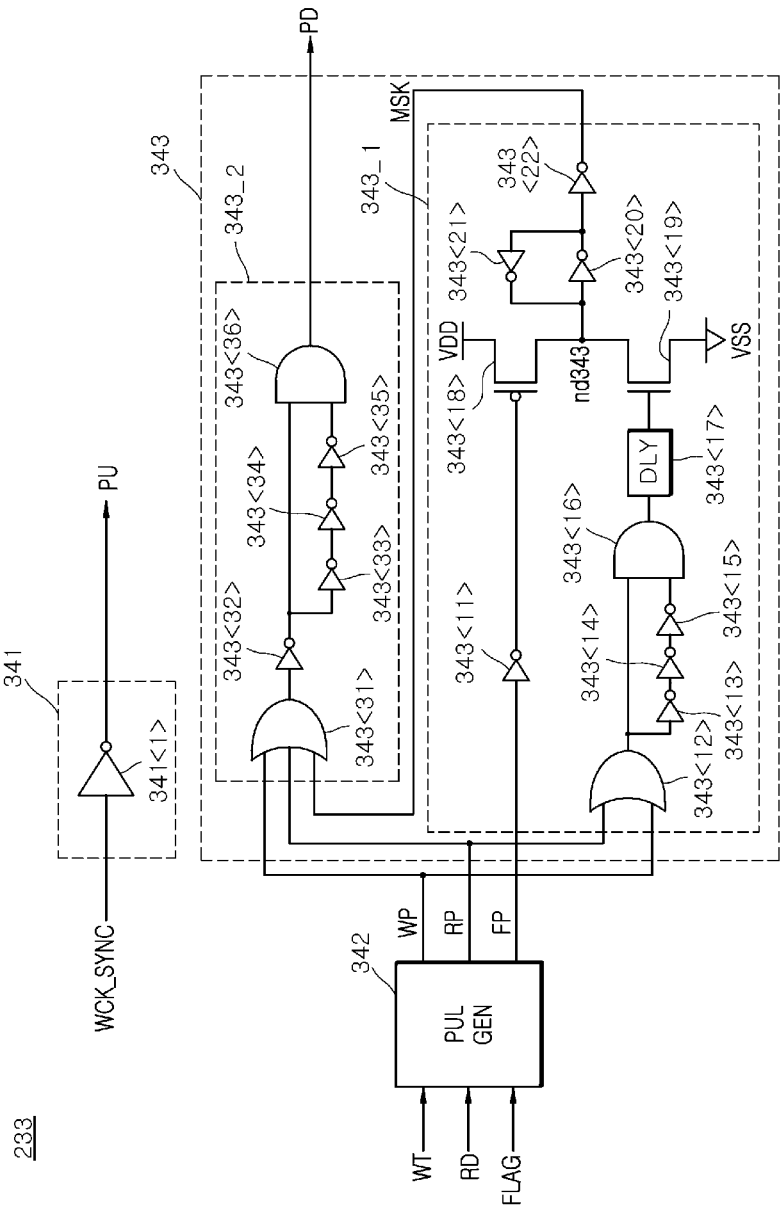
FIG. 20 is a diagram illustrating a configuration according to an embodiment of the driving signal generation circuit that is included in the control circuit illustrated in FIG. 19.

FIG. 20 is a diagram illustrating a configuration according to an embodiment of the driving signal generation circuit 233 that is included in the control circuit 230a. The driving signal generation circuit 233 may include a pull-up driving signal generation circuit 341, a pulse generation circuit (PUL GEN) 342, and a pull-down driving signal generation circuit 343.

The pull-up driving signal generation circuit 341 may be implemented as an inverter 341<1>. The pull-up driving signal generation circuit 341 may generate the pull-up driving signal PU by inverting and buffering the data clock input control signal WCK_SYNC. The pull-up driving signal generation circuit 341 may generate the pull-up driving signal PU that is enabled at a logic low level when the data clock input control signal WCK_SYNC is enabled at a logic high level.

The pulse generation circuit 342 may generate a write pulse WP, a read pulse RP, and a flag pulse FP, based on the write signal WT, the read signal RD, and the flag signal FLAG. The pulse generation circuit 342 may generate the write pulse WP that is disabled after the time that is taken for all of the data DATA<1:N> to be input from timing at which the write signal WT is enabled. The pulse generation circuit 342 may generate the read pulse RP that is disabled after the time that is taken for all of the data DATA<1:N> to be output from timing at which the read signal RD is enabled. The pulse generation circuit 342 may generate the flag pulse FP that is disabled after a set interval from timing at which the flag signal FLAG is enabled. The set interval in which the flag pulse FP is disabled may be variously set in an embodiment.

The pull-down driving signal generation circuit 343 may include a masking signal generation circuit 343_1 and a logic circuit 343_2.

The masking signal generation circuit 343_1 may be implemented by using inverters 343<11>, 343<13>, 333<14>, 343<15>, 343<20>, 343<21>, and 343<22>, an OR gate 343<12>, an AND gate 343<16>, a delay circuit (DLY) 343<17>, a PMOS transistor 343<18>, and an NMOS transistor 343<19>. The inverter 343<11> may invert and buffer the flag pulse FP. The OR gate 343<12>, the inverters 343<13>, 343<14>, and 343<15>, the AND gate 343<16>, and the delay circuit 343<17> may generate a signal that is enabled at a logic high level after the delay time of the delay circuit 333<12> from timing at which the write pulse WP and the read signal RD are enabled from a logic low level to a logic high level. The PMOS transistor 343<18> may be connected between a source voltage VDD and a node nd343, and may drive the node nd343 at the level of the source voltage VDD when the output signal of the inverter 343<11> has a logic low level. The NMOS transistor 343<19> may be connected between the node nd343 and a ground voltage VSS, and may drive the node nd343 at the level of the ground voltage VSS when the output signal of the delay circuit 343<12> has a logic high level. The inverters 343<20>, 343<21>, and 343<22> may generate a masking signal MSK by latching the signal of the node nd343 and buffering the latched signal of the node nd343. The inverters 343<20>, 343<21>, and 343<22> may generate the masking signal MSK that is enabled at a logic high level when the node nd343 is driven at the level of the source voltage VDD. The inverters 343<20>, 343<21>, and 343<22> may generate the masking signal MSK that is disabled at a logic low level when the node nd343 is driven at the level of the ground voltage VSS. The masking signal generation circuit 343_1 may generate the masking signal MSK that is enabled at a logic high level when the flag pulse FP having a logic high level is input. The masking signal generation circuit 343_1 may generate the masking signal MSK that is disabled at a logic low level after any one of the write pulse WP and the read pulse RP, which has a logic high level, is input.

The logic circuit 343_2 may be implemented by using an OR gate 343<31>, inverters 343<32>, 343<33>, 343<34>, and 343<35>, and an AND gate 343<36>. The logic circuit 343_2 may generate the pull-down driving signal PD that is enabled at a logic high level when the write pulse WP having a logic low level is generated after the write pulse WP having a logic high level is input. The logic circuit 343_2 may generate the pull-down driving signal PD that is enabled at a logic high level when the read pulse RP having a logic low level is generated after the read pulse RP having a logic high level is input. The logic circuit 343_2 may generate the pull-down driving signal PD that is enabled at a logic high level when the masking signal MSK having a logic low level is generated after the masking signal MSK having a logic high level is input.

The first memory device 20a disclosed in FIGS. 18 to 20 may be implemented as the same circuit as the first memory device 20 described with reference to FIGS. 16 and 17, and may perform the same operation as the first memory device 20 except that the first memory device 20a performs a data clock extension operation by receiving the flag signal FLAG instead of the synchronization signal WCE, and a detailed description of the first memory device 20a is omitted.

As described above, the semiconductor system 1 according to an embodiment of the present disclosure can maintain a clock synchronization operation when a data clock extension operation is performed before a normal operation is completed after the clock synchronization operation is performed. In an embodiment, the semiconductor system 1 can reduce current consumption because the data clock WCLK is not generated again by maintaining the clock synchronization operation when the data clock extension operation is performed before the normal operation is completed.

Figure 21:
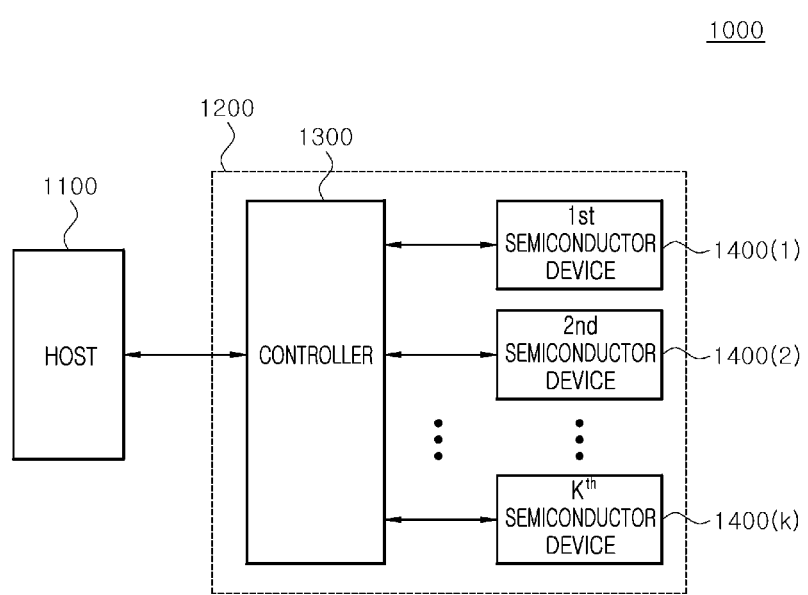
FIG. 21 is a diagram illustrating a configuration according to an embodiment of an electronic system to which the semiconductor system illustrated in FIGS. 1 to 20 has been applied.

FIG. 21 is a block diagram illustrating a configuration according to an embodiment of an electronic system 1000 according to an embodiment of the present disclosure. As illustrated in FIG. 21, the electronic system 1000 may include a host 1100 and a semiconductor system 1200.

The host 1100 and the semiconductor system 1200 may mutually transmit signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), a universal serial bus (USB).

The semiconductor system 1200 may include a controller 1300 and semiconductor devices 1400(K:1). The controller 1300 may control the semiconductor devices 1400(K:1) so that the semiconductor devices 1400(K:1) perform a clock synchronization operation, a normal operation, and a data clock extension operation. Each of the semiconductor devices 1400(K:1) may maintain a clock synchronization operation when a second normal operation is performed before a first normal operation is completed after the clock synchronization operation is performed. Each of the semiconductor devices 1400(K:1) may maintain a clock synchronization operation when a data clock extension operation is performed before a normal operation is completed after a clock synchronization operation is performed. Each of the semiconductor devices 1400(K:1) may maintain a clock synchronization operation when a data clock extension operation is performed before a normal operation for any one of the semiconductor devices 1400(K:1) is completed.

The semiconductor system 1200, in an embodiment, can reduce current consumption because a data clock is not generated again by maintaining a clock synchronization operation when a second normal operation is performed before a first normal operation is completed after a clock synchronization operation of the semiconductor devices 1400(K:1) is performed. In an embodiment, the semiconductor system 1200 can reduce current consumption because a data clock is not generated again by maintaining a clock synchronization operation when a data clock extension operation is performed before a normal operation is completed after a clock synchronization operation of the semiconductor devices 1400(K:1) is performed. In an embodiment, the semiconductor system 1200 can reduce current consumption because a data clock is not generated again by maintaining a clock synchronization operation when a data clock extension operation is performed before a normal operation of any one of multiple semiconductor devices, among the semiconductor devices 1400(K:1), is completed.

The controller 1300 may be implemented as the controller 10 illustrated in FIG. 1. Each of the semiconductor devices 1400(K:1) may be implemented as the first memory device 20 and the second memory device 30 illustrated in FIG. 1. In some embodiments, each of the semiconductor devices 1400(K:1) may be implemented as one of dynamic random access memory (DRAM), phase change random access memory (PRAM), resistive random access memory (RRAM), magnetic random access memory (MRAM), and ferroelectric random access memory (FRAM).

What is claimed is:

1. A semiconductor device comprising:
  a driving signal generation circuit configured to generate a pull-up driving signal that is enabled when a data clock input control signal is input during a normal operation, configured to generate a pull-down driving signal that is enabled when any one of a write signal and a read signal is input, and configured to generate the pull-down driving signal that is enabled after a set interval when a synchronization signal is input; and
  a sync enable signal generation circuit configured to generate a sync enable signal for receiving a data clock from a time at which the pull-up driving signal is enabled to a time at which the pull-down driving signal is enabled.

2. The semiconductor device of claim 1, wherein the synchronization signal is generated from a command address that is input during the normal operation.

3. The semiconductor device of claim 1,
  wherein the data clock is a signal having a frequency that is a 2N multiple of a frequency of a clock,
  wherein the data clock is a signal that is periodically toggled in order to latch data that is input and output through an external device, and
  wherein N is a natural number greater than zero.

4. The semiconductor device of claim 1, wherein the driving signal generation circuit comprises:
  a pull-up driving signal generation circuit configured to generate the pull-up driving signal by inverting and buffering the data clock input control signal;
  a pulse generation circuit configured to generate a write pulse, a read pulse, and a synchronization pulse comprising pulses that are generated when the write signal, the read signal, and the synchronization signal are enabled; and
  a pull-down driving signal generation circuit configured to generate the pull-down driving signal that is enabled after the set interval from a time at which any one of the write pulse, the read pulse, and the synchronization pulse is input.

5. The semiconductor device of claim 1, further comprising:
  a data clock input circuit configured to receive the data clock during an interval in which the sync enable signal is enabled and configured to generate first to fourth internal clocks by dividing a frequency of the data clock that has been received; and a data input and output circuit configured to latch data that is input in series from an external device in synchronization with the first to fourth internal clocks after a start of a write operation of the normal operation, configured to generate internal data to be stored in a memory circuit from the data that has been latched, configured to latch the internal data that is output from the memory circuit in synchronization with the first to fourth internal clocks after a start of a read operation of the normal operation, configured to generate data from the internal data that has been latched, and configured to output, to the external device, the data that has been generated.

6. The semiconductor device of claim 5, wherein the data clock input circuit comprises:
   an input buffer circuit configured to generate an input clock by receiving the data clock during the interval in which the sync enable signal is enabled; and
   a frequency division circuit configured to generate the first to fourth internal clocks by dividing a frequency of the input clock during the interval in which the sync enable signal is enabled.

7. The semiconductor device of claim 5, wherein the data input and output circuit comprises:
   a write processing circuit configured to latch the data that is input in series from the external device in synchronization with the first to fourth internal clocks when the write signal is enabled and configured to generate the internal data from the data that has been latched; and
   a read processing circuit configured to latch the internal data in synchronization with the first to fourth internal clocks when the read signal is enabled, configured to generate the data from the internal data that has been latched, and configured to output, to the external device, the data that has been generated.

8. The semiconductor device of claim 7, wherein the write processing circuit comprises:
   a write alignment data generation circuit configured to latch the data that is input in series from the external device in synchronization with the first to fourth internal clocks when the write signal is enabled and configured to generate write alignment data by parallelizing the data that has been latched; and
   a write driver configured to generate the internal data from the write alignment data and configured to output, to the memory circuit, the internal data that has been generated.

9. The semiconductor device of claim 7, wherein the read processing circuit comprises:
   a read serial data generation circuit configured to latch the internal data that is input in parallel from the memory circuit in synchronization with the first to fourth internal clocks when the read signal is enabled and configured to generate read serial data by serializing the internal data that has been latched; and
   a read driver configured to generate the data from the read serial data and configured to output, to the external device, the data that has been generated.

10. The semiconductor device of claim 1, wherein the pull-down driving signal, that is enabled, is generated after the set interval by blocking any one of the input of the write signal WT and the read signal RD when the synchronization signal is input.

11. A semiconductor device comprising:
    a driving signal generation circuit configured to generate a pull-up driving signal that is enabled when a data clock input control signal is input during a normal operation and configured to generate a pull-down driving signal that is enabled when any one of a write signal, a read signal, and a synchronization signal is input; and
    a sync enable signal generation circuit configured to generate a sync enable signal for receiving a data clock from a time at which the pull-up driving signal is enabled to a time at which the pull-down driving signal is enabled.

12. The semiconductor device of claim 11, wherein the synchronization signal is generated from a command address that is input before a write operation and a read operation are completed in the normal operation.

13. The semiconductor device of claim 11, wherein the driving signal generation circuit comprises:
    a pull-up driving signal generation circuit configured to generate the pull-up driving signal by inverting and buffering the data clock input control signal;
    a pulse generation circuit configured to generate a write pulse, a read pulse, and a synchronization pulse comprising pulses that are generated when the write signal, the read signal, and the synchronization signal are enabled; and
    a pull-down driving signal generation circuit configured to generate a pull-down driving signal that is enabled when any one of the write pulse, the read pulse, and the synchronization pulse is input and that is disabled after when the write pulse and the read pulse are enabled.

14. The semiconductor device of claim 13, wherein the pull-down driving signal generation circuit comprises:
    a masking signal generation circuit configured to generate a masking signal that is enabled when the synchronization pulse is input and that is disabled after any one of the write pulse and the read pulse is input; and
    a logic circuit configured to generate the pull-down driving signal that is enabled after any one of the write pulse, the read pulse, and the masking signal is input.

* * * * *